United States Patent
Amamiya

[11] Patent Number: 6,037,616
[45] Date of Patent: Mar. 14, 2000

[54] BIPOLAR TRANSISTOR HAVING BASE CONTACT LAYER IN CONTACT WITH LOWER SURFACE OF BASE LAYER

[75] Inventor: Yasushi Amamiya, Tokyo, Japan

[73] Assignee: NEC Corporation, Tokyo, Japan

[21] Appl. No.: 08/989,826

[22] Filed: Dec. 12, 1997

[30] Foreign Application Priority Data

Dec. 12, 1996 [JP] Japan .................................. 8-332208

[51] Int. Cl.[7] .................. H01L 31/0328; H01L 31/0336; H01L 31/072; H01L 31/109
[52] U.S. Cl. .......................... 257/198; 257/197; 257/586; 257/587
[58] Field of Search .................... 257/197, 198, 257/584, 586, 587

[56] References Cited

U.S. PATENT DOCUMENTS

| | | |
|---|---|---|
| 4,825,265 | 4/1989 | Lunardi et al. . |
| 4,996,166 | 2/1991 | Ohshima . |
| 5,003,366 | 3/1991 | Mishima et al. . |
| 5,036,372 | 7/1991 | Ohishi et al. . |
| 5,329,245 | 7/1994 | Nakagawa ............................ 257/198 |
| 5,332,912 | 7/1994 | Nozu et al. ............................ 257/197 |
| 5,567,961 | 10/1996 | Usagawa et al. ..................... 257/197 |

FOREIGN PATENT DOCUMENTS

| | | |
|---|---|---|
| 61-159763 | 7/1986 | Japan . |
| 61-292365 | 12/1986 | Japan . |
| 63-47974 | 2/1988 | Japan . |
| 63-81977 | 4/1988 | Japan . |
| 2-78226 | 3/1990 | Japan . |
| 3-20037 | 1/1991 | Japan . |
| 3-124033 | 5/1991 | Japan . |
| 4-96334 | 3/1992 | Japan . |
| 4-186617 | 7/1992 | Japan . |

OTHER PUBLICATIONS

Hidenori Shimawaki et al., "High–fmax AlGaAs/InGaAs and AlGaAs/GaAs HBT's with p+/p Regrown Base Contact", IEE Transaction on Electron Devices., vol. 42, No. 10, Oct. 1995.

Yasushi Amamiya et al., "Lateral p+/p Regrown Base Contacts for AlGaAs/InGaAs HBTs with Extremely Thin Base Layers", IEE 1996 54th Annual Device Research Conference Digist, pp. 38–39, 1996.

*Primary Examiner*—Ngân V. Ngô
*Attorney, Agent, or Firm*—Foley & Lardner

[57] ABSTRACT

In a bipolar transistor including a semi-insulating substrate, a collector layer formed on the semi-insulating substrate and a base layer formed on the collector layer, a base contact layer is in contact; with a part of a lower surface of the base layer.

38 Claims, 22 Drawing Sheets

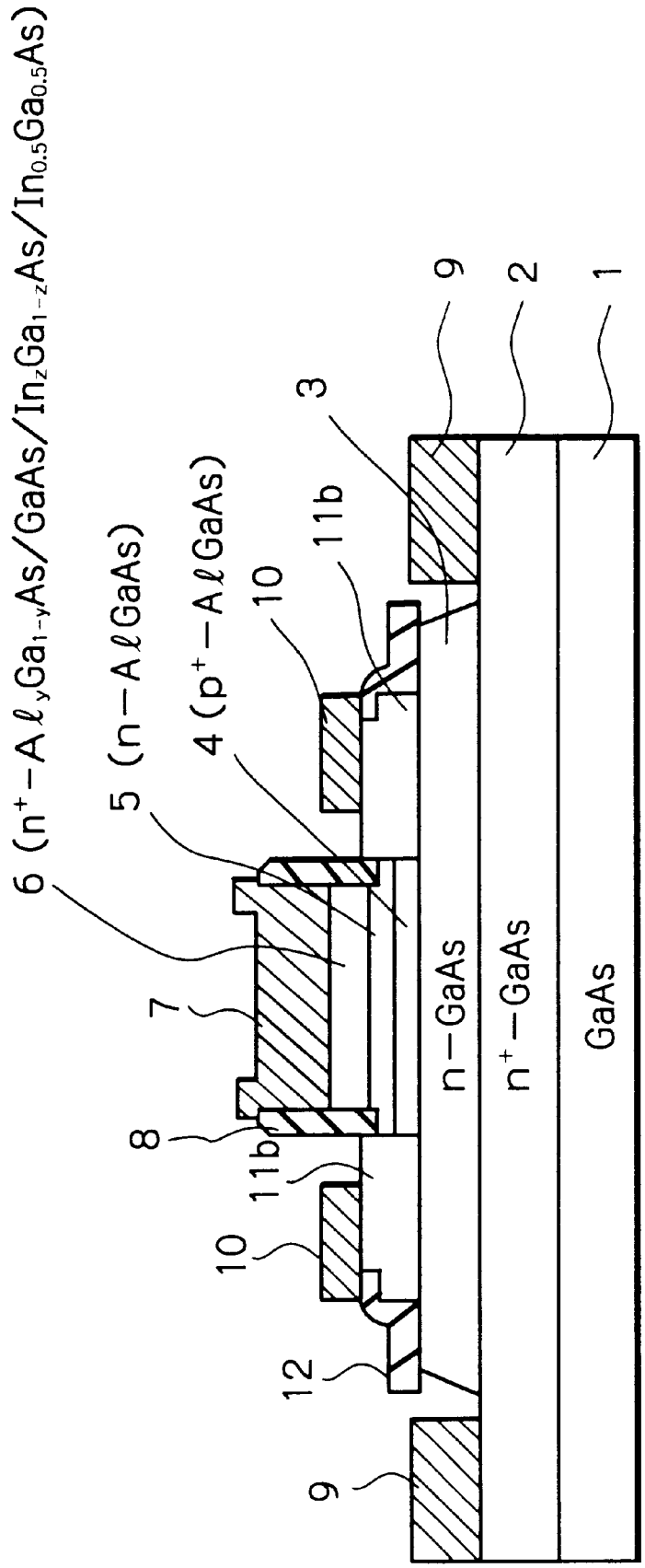

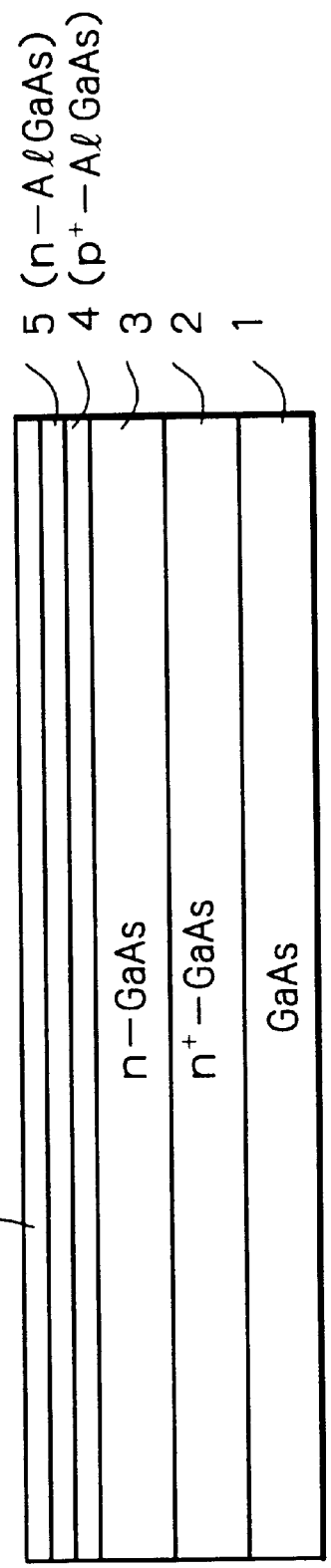
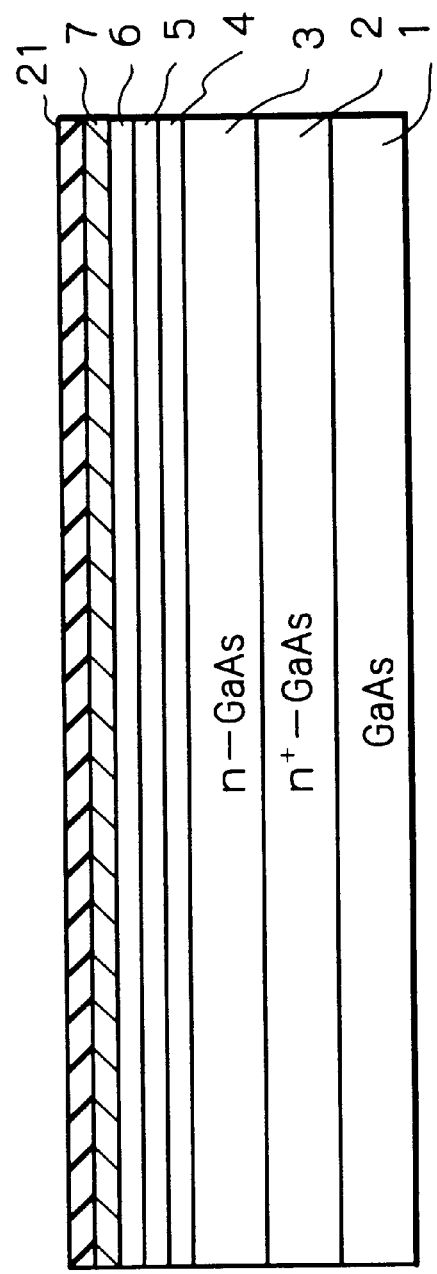

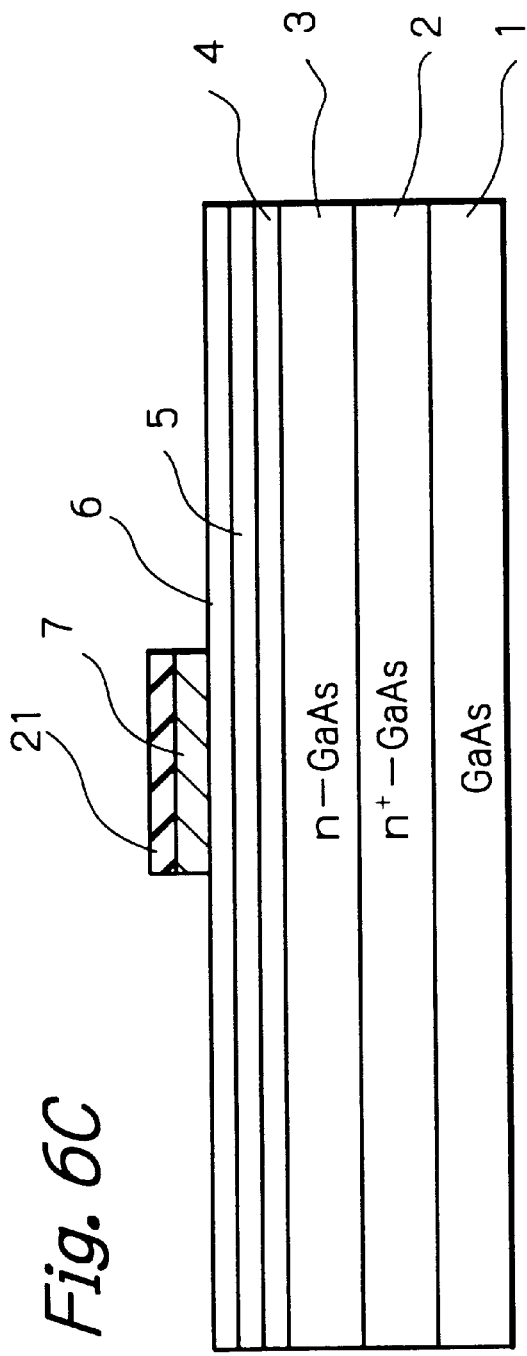
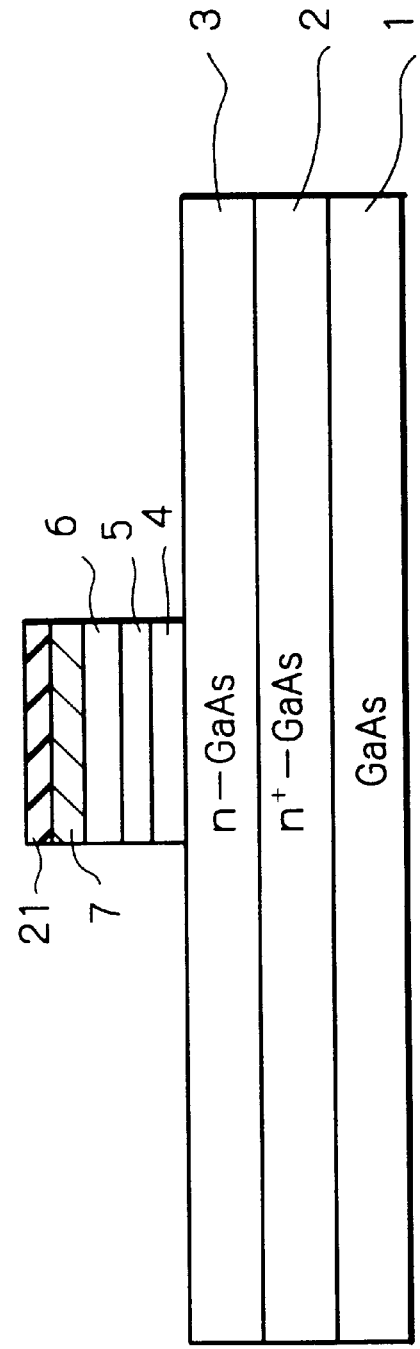

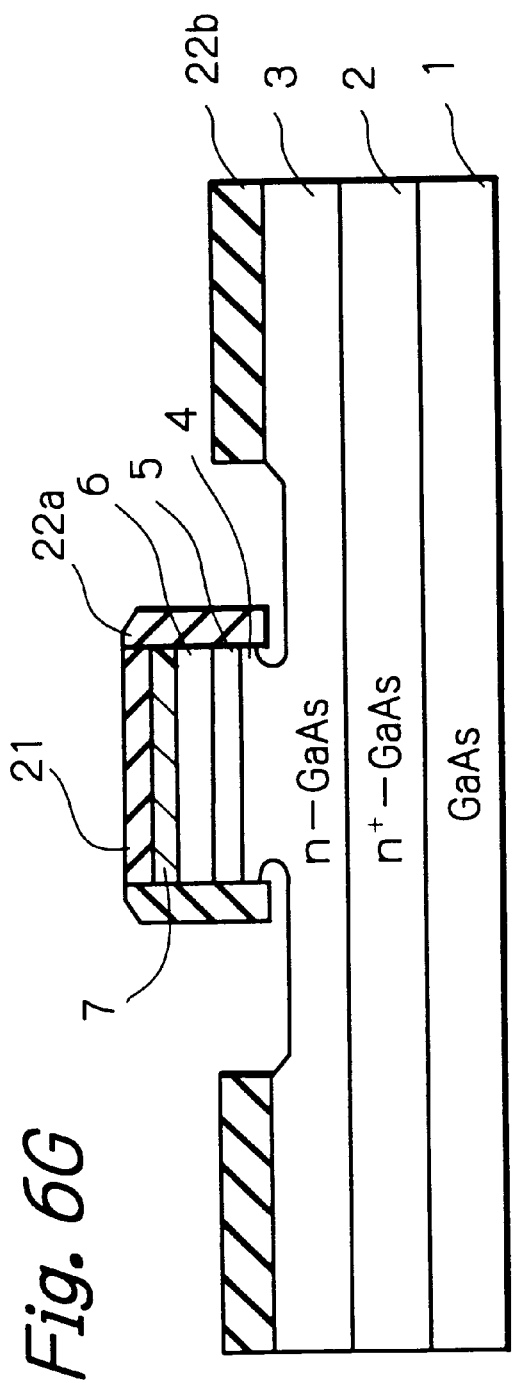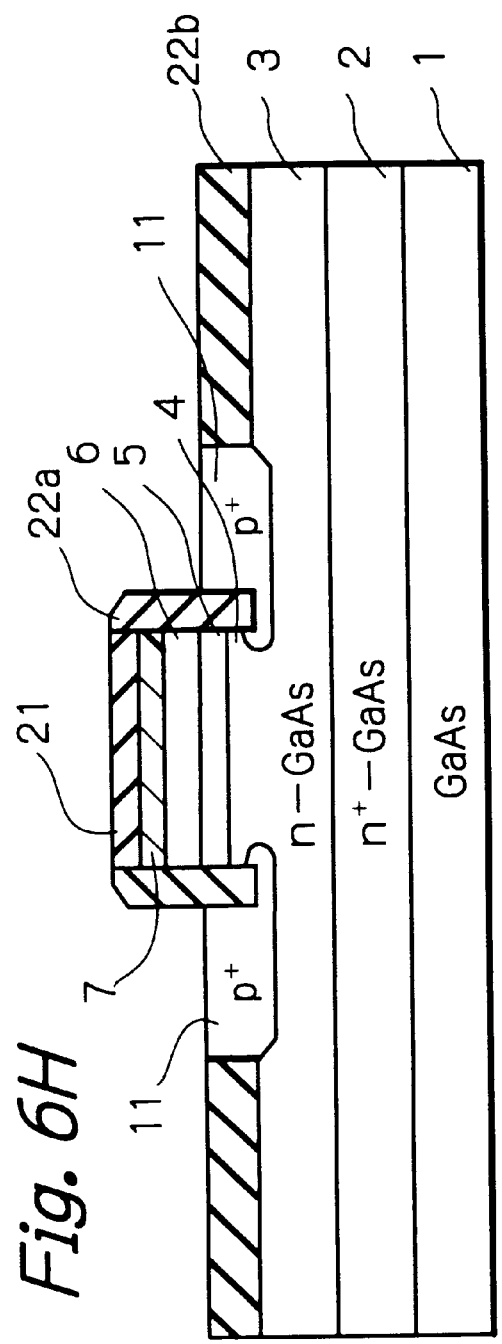

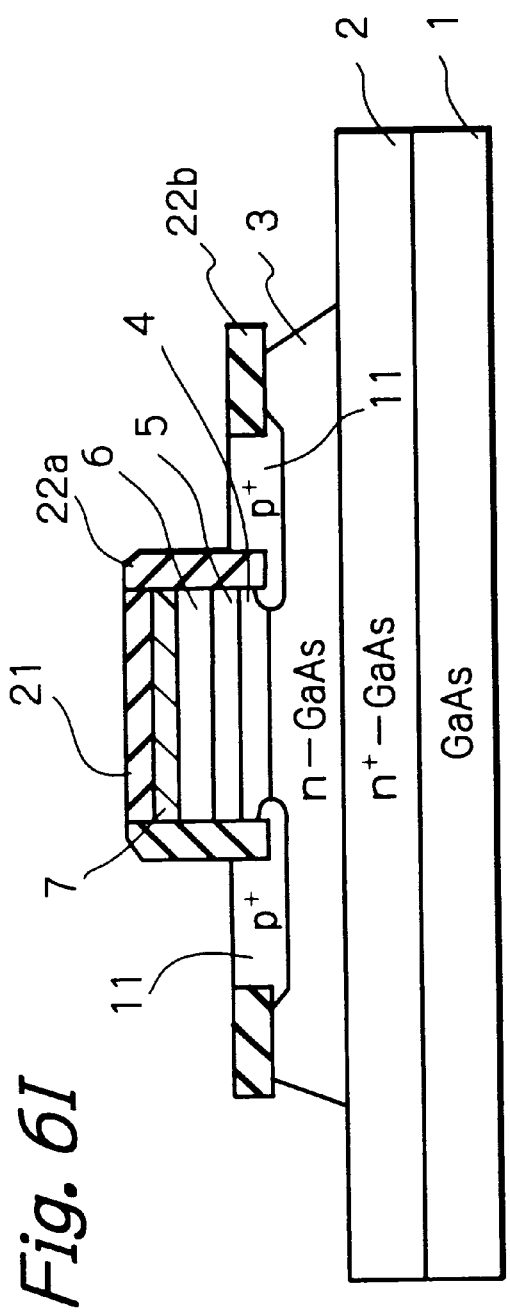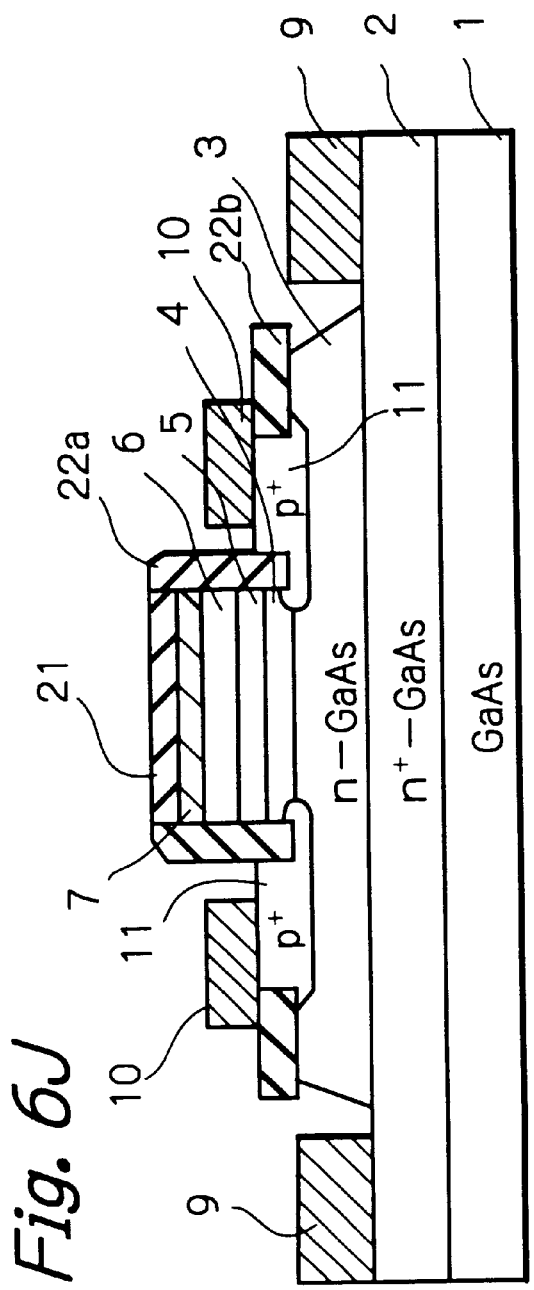

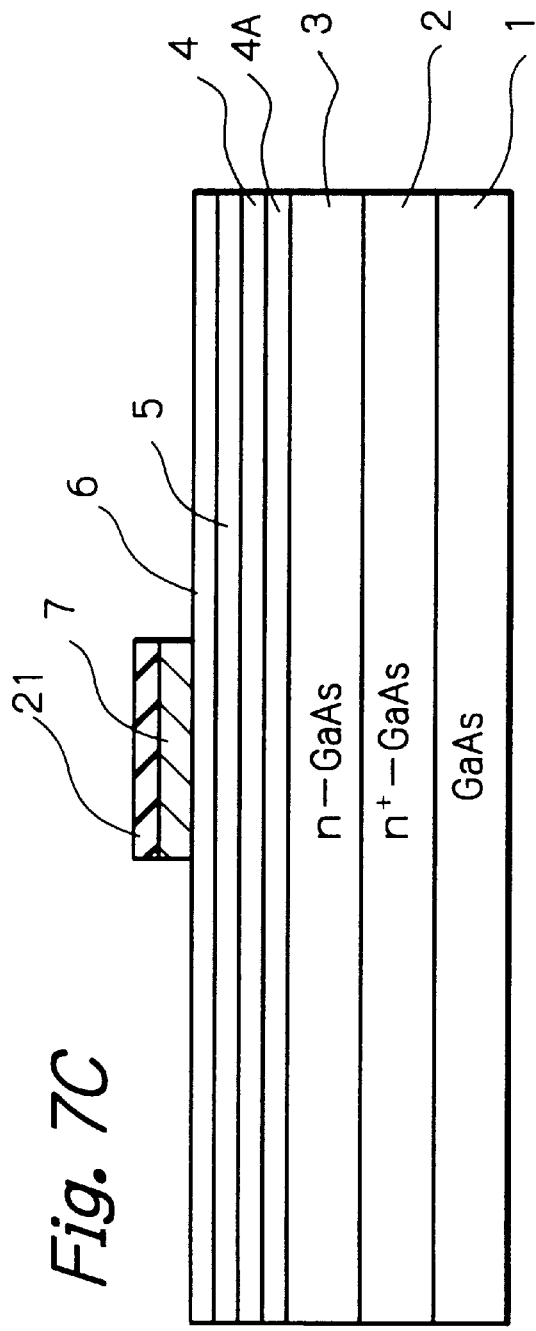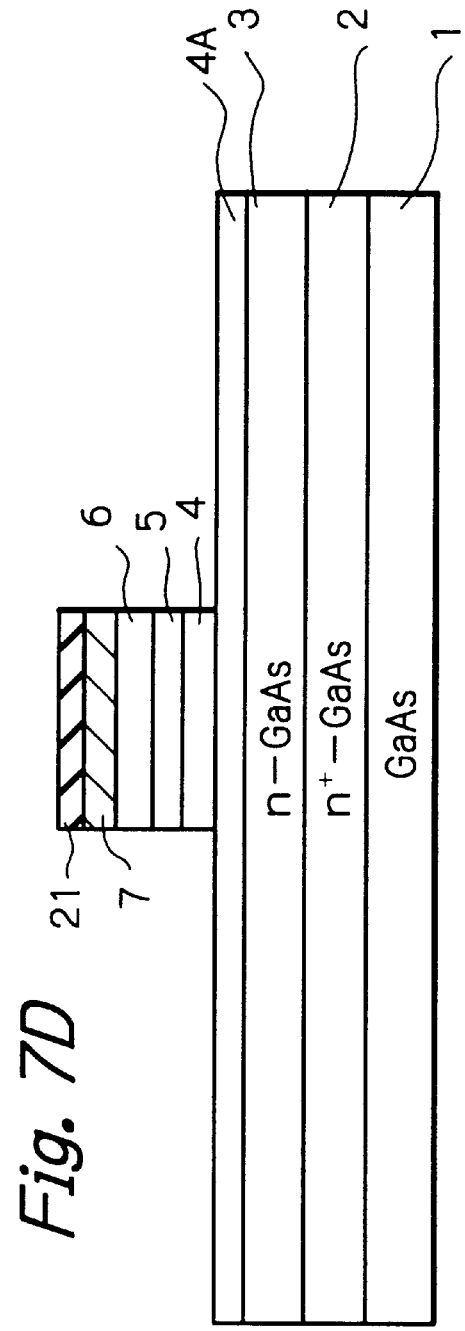

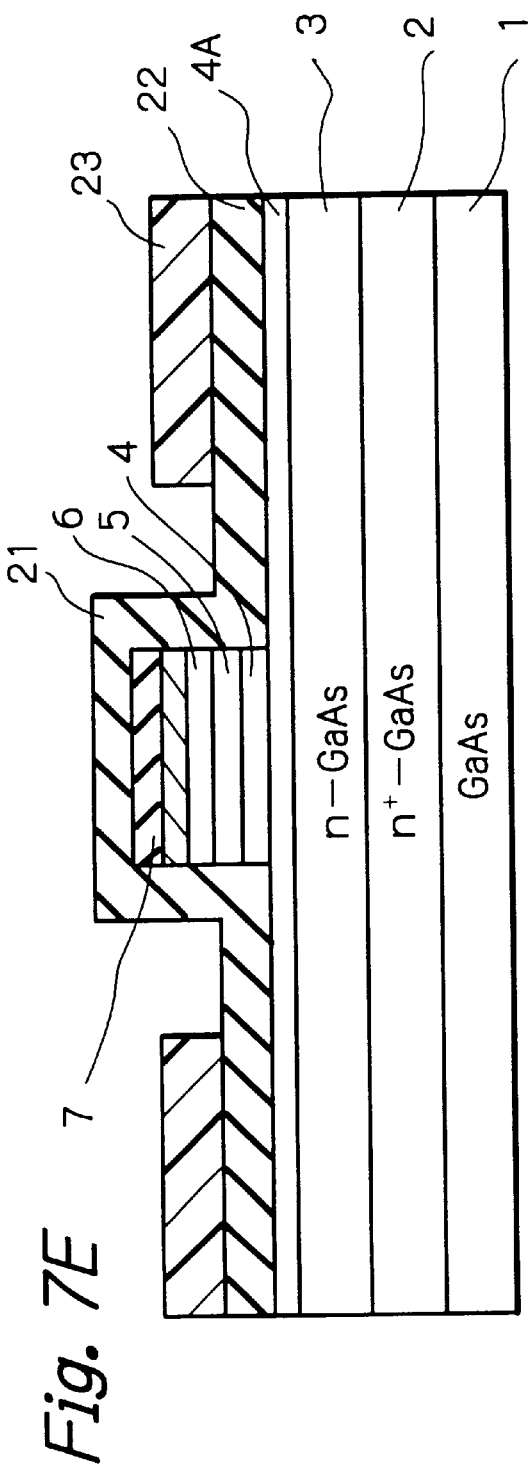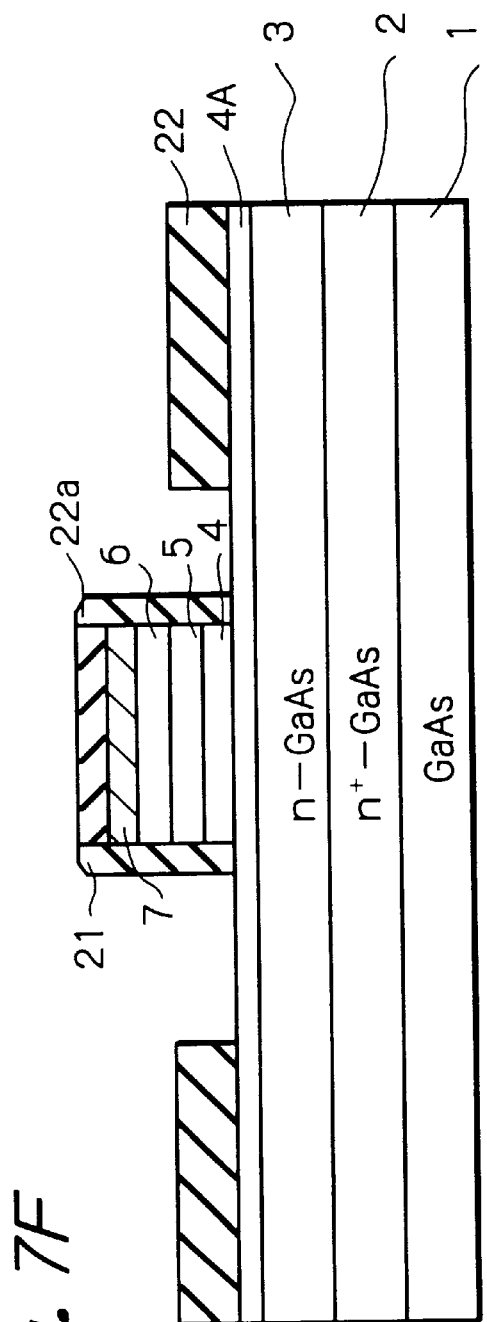

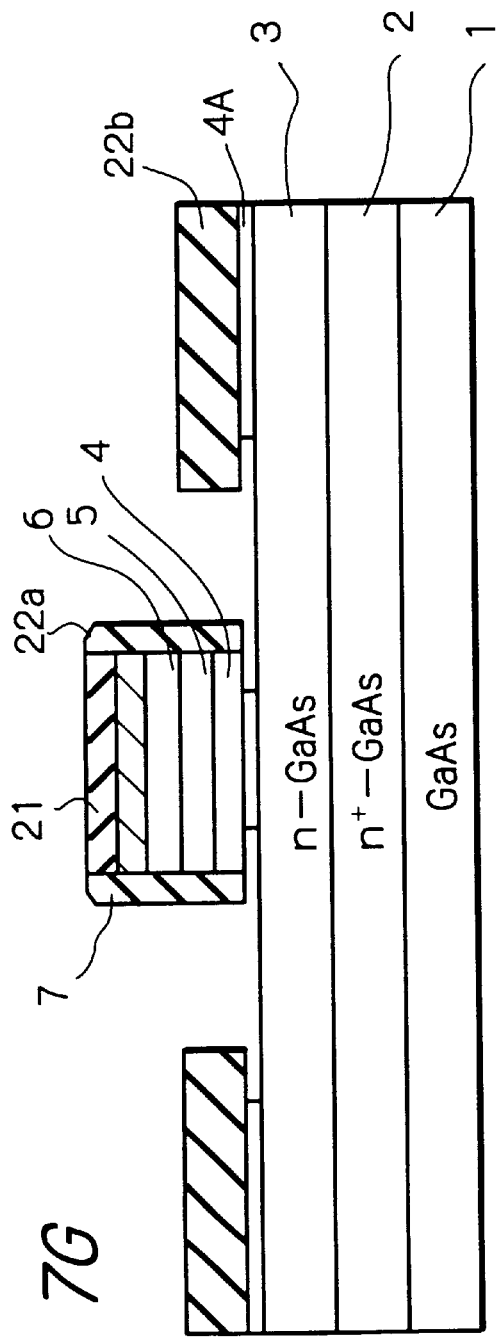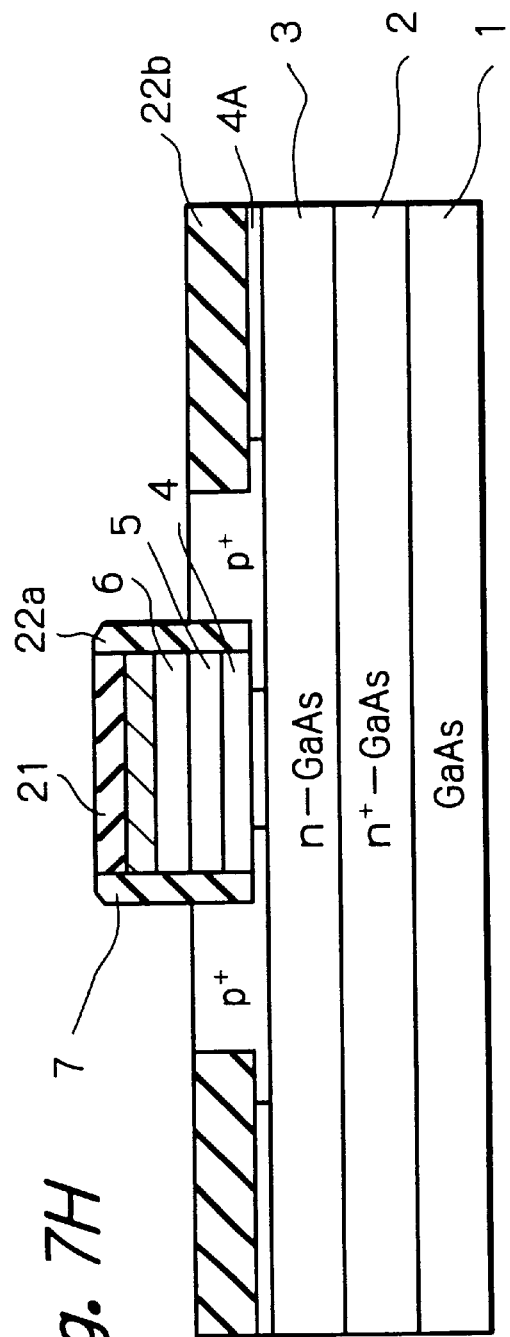

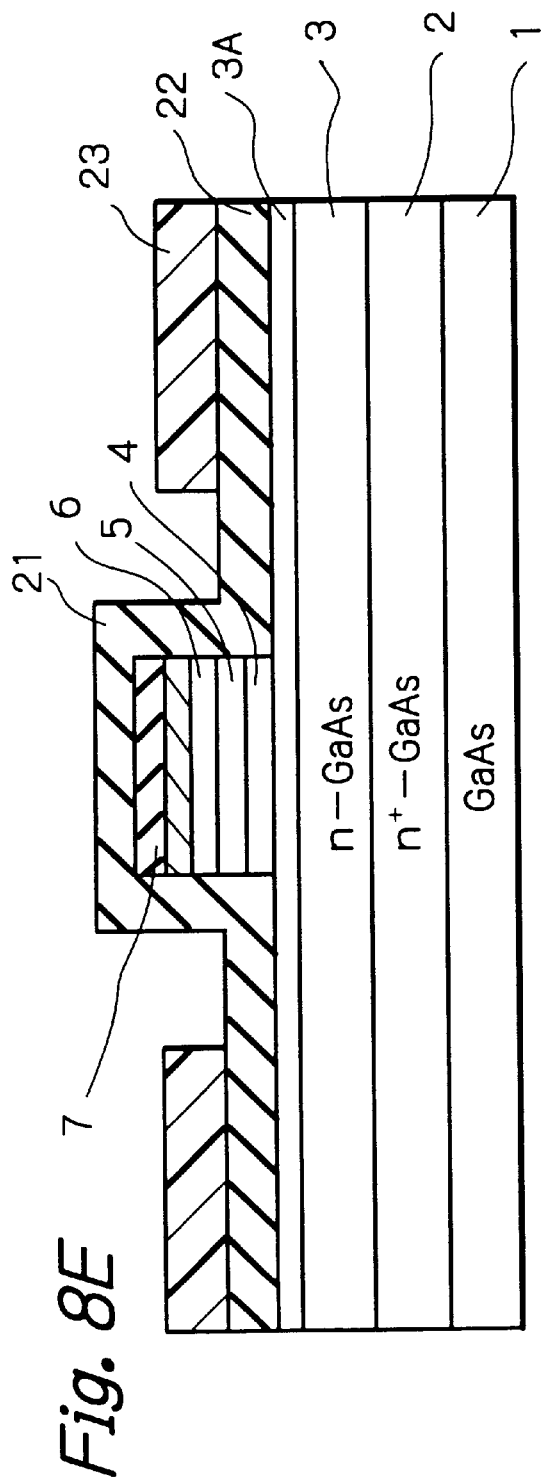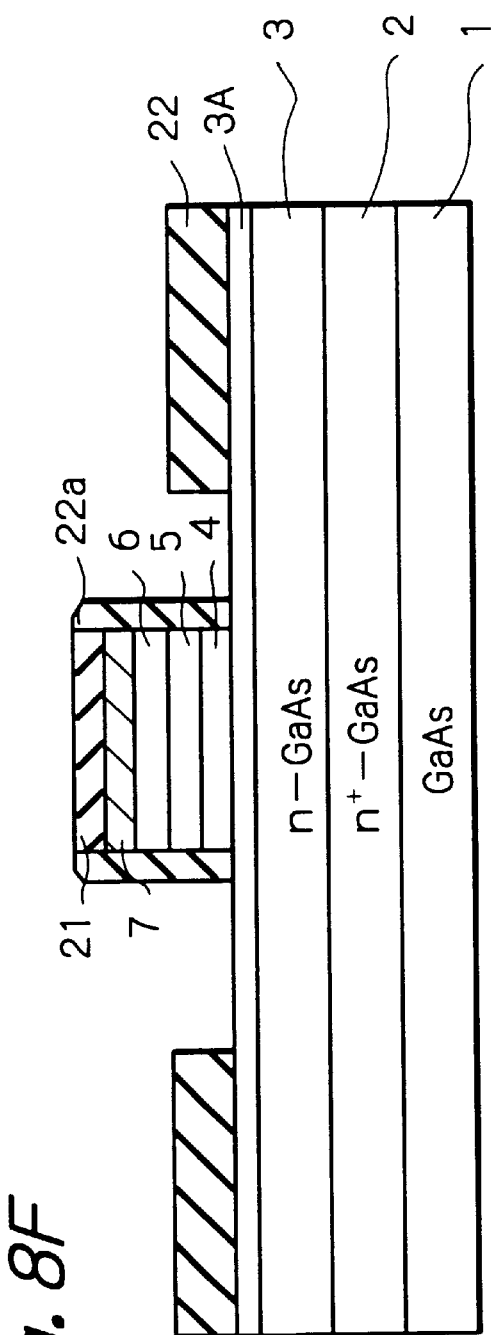

BIPOLAR TRANSISTOR HAVING BASE CONTACT LAYER IN CONTACT WITH LOWER SURFACE OF BASE LAYER

BACKGROUND OF THE INVENTION

1. Field of the Invention

The present invention relates to a bipolar transistor such as a heterostructured bipolar transistor (HBT) and its manufacturing method.

2. Description of the Related Art

HBTs using an AlGaAs/GaAs heterostructre have been developed as high speed microwave or millimeterwave devices.

In order to increase the operation speed, a composition graded base layer has been introduced to reduce the transit time of carriers within the base layer.

In a first prior art HBT, the composition of $Al_xGa_{1-x}As$ of a base layer is graded from x=0 at the interface between a collector layer and the base layer to x=0.1 at the interface between the base layer and an emitter layer (see: JP-A-61-292365, JP-A-63-47974, JP-A-63-81977 & JP-A-4-96334). In this graded Al composition base layer, the energy band gap is gradually decreased from the emitter side to the collector side, so that a strong electric field is generated within the base layer, thus reducing the transit time of carriers within the base layer. This increases the operation speed of the HBT. This will be explained later in detail.

In the first prior art HBT, before the formation of a base electrode, the upper surface of the base layer having a high aluminum composition has to be exposed. As a result, the upper surface of the base layer is easily oxidized by the open air before the formation of the base electrode. Therefore, an ohmic contact resistance between the base electrode and the base layer is increased.

In order to reduce the above-mentioned ohmic contact resistance, the base electrode is made of metal alloy such as Pt/Ti/Pt/Au. That is, when a heat treatment is performed thereupon, the metal alloy is diffused into the base layer through the aluminum oxide therebetween, thus reducing the ohmic contact resistance therebetween. In this case, the Pt composition of the metal alloy serves as a barrier for diffusion of Ti or Au, thus obtaining a stable ohmic contact resistance (see: JP-A-4-186617).

In the first prior art HBT, however, even if the Pt composition of the base electrode serves as a diffusion barrier, it is still difficult to control a depth of diffusion of metal alloy into the base layer, since the base layer is very thin. In addition, a thermally stable ohmic contact resistance cannot be obtained.

In a second prior art HRT, a thin n-type AlGaAs emitter layer covers the entire surface of the base layer. Therefore, since the base layer is not exposed, the aluminum composition of thereof is hardly oxidized by the open air. That is, when a heat treatment is performed upon metal alloy, the metal alloy is diffused into the base layer through the thin emitter layer, thus reducing the ohmic contact resistance therebetween. This will also be explained later in detail.

Even in the second prior art HBT, it is still difficult to control a depth of diffusion of metal alloy into the base layer, since the base layer is very thin. In addition a thermally stable ohmic contact resistance cannot be obtained.

In a third prior art HBT, a base contact region is formed on the sides of the base layer by implanting ions into the base layer and the collector layer. This will also be explained later in detail.

In the third prior art HBT, however, since a high temperature heat treatment for activating implanted carriers is necessary after the ion-implantation, this heat treatment changes impurity distributions of the other semiconductor layers which deteriorates the characteristics thereof. Further, the ion-implantation damages the crystalline structure and thus increases recombination currents.

In fourth and fifth prior art HBTs (see: H. Shimawaki et al., "High-$f_{max}$AlGaAs/InGaAs and AlGaAs/GaAs HBT's with p+/p Regrown Base Contacts", IEEE Trans. on Electron Devices, Vol. 42, No. 10, pp. 1735–1744, October 1995), a p+-GaAs base contact layer is regrown by a metal-organic molecular beam epitaxy (MOMBE) process using silicon oxide as a mask. In both cases, even if the contact area between the base layer and the base contact layer is small, a sufficiently small base resistance can be obtained (see: Y. Amamiya et al., "Lateral p+/p Regrown Base Contacts for AlGaAs/In-GaAs HBTs with Extremely Thin Base Layers", IEEE 1996 54TH Annual Device Conference Digest, pp. 38–39, 1996). This will also be explained later in detail.

In the fourth and fifth prior art HBTs, since the base contact layers are formed without ion-implantation, the energy band gap of the base contact layers can be small, so that the ohmic contact resistance can be reduced. Also, since a high temperature heat treatment for activating carriers is unnecessary after the ion-implantation, the characteristics of the semiconductor layers are not deteriorated. Further, the damage of the crystalline structure can be avoided, and accordingly, recombination currents are not increased.

In the fourth and fifth prior art EBTs, however, when a graded Al composition layer is used as a base layer, an exposed surface of the base layer is also easily oxidized by the open air in the same way as in the first prior art EST.

SUMMARY OF THE INVENTION

It is an object of the present invention to provide a bipolar transistor capable of reducing the transit time of carriers and the base resistance without the effect caused by the energy band discontinuity of a base contact layer and the aluminum composition of a base layer.

According to the present invention, in a bipolar transistor including a semi-insulating substrate, a collector layer formed on the semi-insulating substrate and a base layer formed on the collector layer, a base contact layer is in contact with a part of a lower surface of the base layer.

If the base layer is made of graded AlgaAs, the aluminum composition at the tower surface of the base layer is low, any negative effect of the aluminum composition is relieved.

BRIEF DESCRIPTION OF THE DRAWINGS

The present invention will be more clearly understood from the description as set forth below, in comparison with the prior art, with reference to the accompanying drawings, wherein:

FIG. 5 is a cross-sectional view illustrating a fifth prior art HBT;

FIGS. 6A through 6J are cross-sectional views for explaining a first embodiment of the method for manufacturing an HBT according to the present invention;

FIGS. 7A through 7J are cross-sectional views for explaining a first embodiment of the method for manufacturing an HBT according to the present invention;

FIGS. 8A through 8J are cross-sectional views for explaining a first embodiment of the method for manufacturing an HBT according to the present invention;

FIGS. 9A, 9B and 9C are cross-sectional views illustrating modifications of the base layer of the embodiments; and.

DESCRIPTION OF THE PREFERRED EMBODIMENTS

Before the description of the preferred embodiments, prior art HBTs will be explained with reference to FIGS. 1 through 5.

Figure 1:
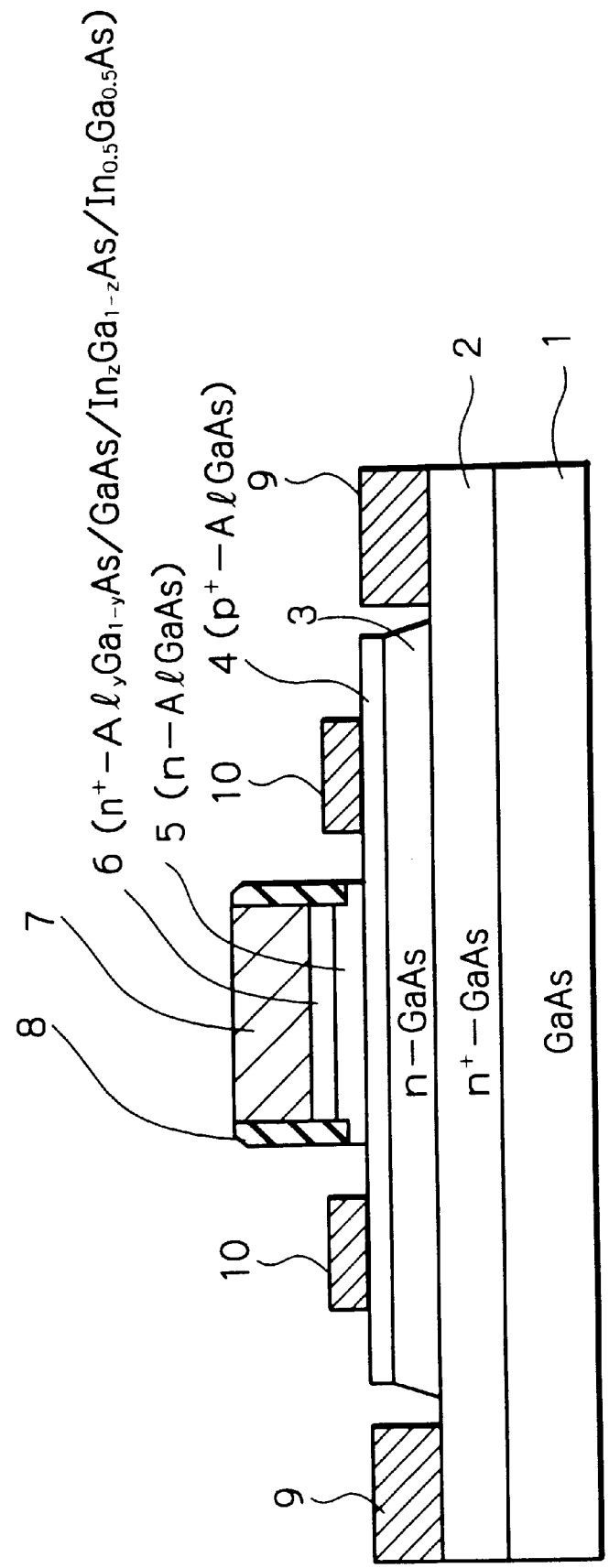
FIG. 1 is a cross-sectional view illustrating a first prior art HBT.

In FIG. 1, which illustrates a first prior art HBT, grown on a semi-insulating GaAs substrate 1 are an n$^+$-type GaAs collector contact layer 2, an n-type GaAs collector layer 3, a p$^+$-type $Al_xGa_{1-x}As$ base layer 4, an n-type AlGaAs emitter layer 5 and an n$^+$-type $Al_yGa_{1-y}As/GaAs/In_zGa_{1-z}As/In_{0.5}Ga_{0.5}As$ emitter cap layer 6 by a molecular beam epitaxy (MBE) process, a metal-organic chemical vapor deposition (MOCVD) or a vapor-phase epitaxy (VPE) process. Also, an emitter electrode layer 7 is formed on the emitter cap layer 6, and a sidewall silicon oxide layer 8 is formed on the sidewalls of the emitter electrode layer 7, the emitter cap layer 6 and the emitter layer 5. Further, a collector electrode layer 9 and a base electrode layer 10 are formed on the collector contact layer 2 and the base layer 4.

The composition of $Al_xGa_{1-x}As$ of the base layer 4 is graded from x=0 at the interface between the collector layer 3 and the base layer 4 to x=0.1 at the interface between the base layer 4 to the emitter layer 5 (see: JP-A-61-292365, JP-A-63-47974, JP-A-63-81977 & JP-A-4-96334). In this graded Al composition base layer 4, the energy band gap is gradually decreased from the emitter side to the collector side, so that a strong electric field is generated within the base layer 4, thus reducing the transit time of carriers within the base layer 4. This increases the operation speed of the HBT of FIG. 1.

In the HBT of FIG. 1, before the formation of the base electrode 10, the upper surface of the base layer 4 having a high aluminum, composition has to be exposed. As a result, the upper surface of the base layer 4 is easily oxidized by the open air before the formation of the base electrode 10. Therefore, an ohmic contact resistance between the base electrode 10 arid the base layer 4 is increased.

In order to reduce the above-mentioned ohmic contact resistance, the base electrode 10 is made of metal alloy such as Pt/Ti/Pt/Au. That is, when a heat treatment is performed thereupon, the metal alloy is diffused into the base layer 4 through the aluminum oxide therebetween, thus reducing the ohmic contact resistance therebetween. In this case, the Pt composition of the metal alloy serves as a barrier for diffusion of Ti or Au, thus obtaining a stable ohmic contact resistance (see: JP-A-4-186617).

In the HBT of FIG. 1, however, even if the Pt composition of the base electrode 10 serves as a diffusion barrier, it is still difficult to control a depth of diffusion of a metal alloy into the base layer 4, since the base layer 4 is very thin. Thus, a thermally stable ohmic contact resistance cannot be obtained.

Figure 2:
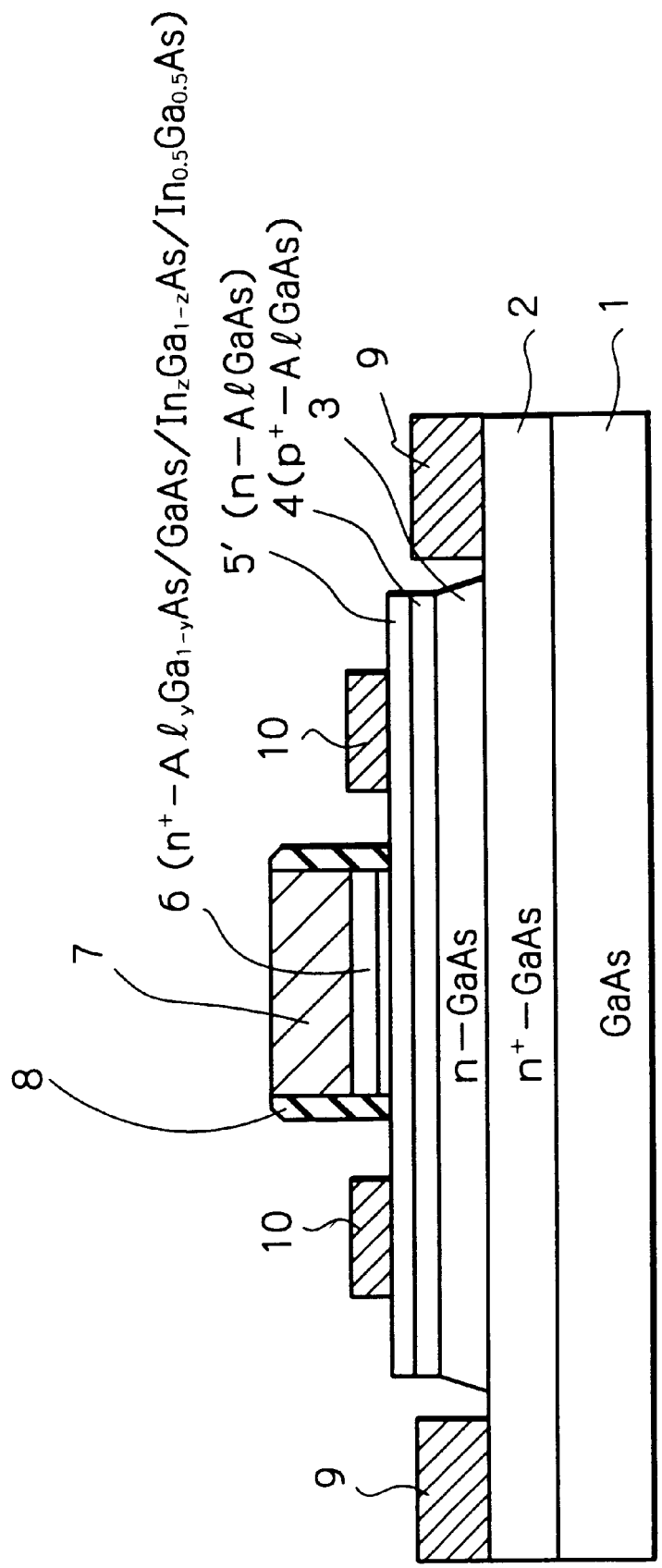
FIG. 2 is a cross-sectional view illustrating a second prior art HBT.

In FIG. 2, which illustrates a second prior art HBT, a thin n-type AlGaAs emitter layer 5' is provided instead of the n-type AlGaAs emitter layer 5 of FIG. 1. The emitter layer 5' covers the entire surface of the base layer 4. Therefore, since the base layer 4 is not exposed, the aluminum composition thereof is hardly oxidized by the open air. That is, when a heat treatment is performed upon the metal alloy, the metal alloy is diffused into the base layer 4 through the thin emitter layer 5', thus reducing the ohmic contact resistance therebetween.

Even in the HBT of FIG. 2, it is still difficult to control a depth of diffusion of metal alloy into the base layer 4, since the base layer 4 is very thin. Thus, a thermally stable ohmic contact resistance cannot be obtained.

Figure 3:
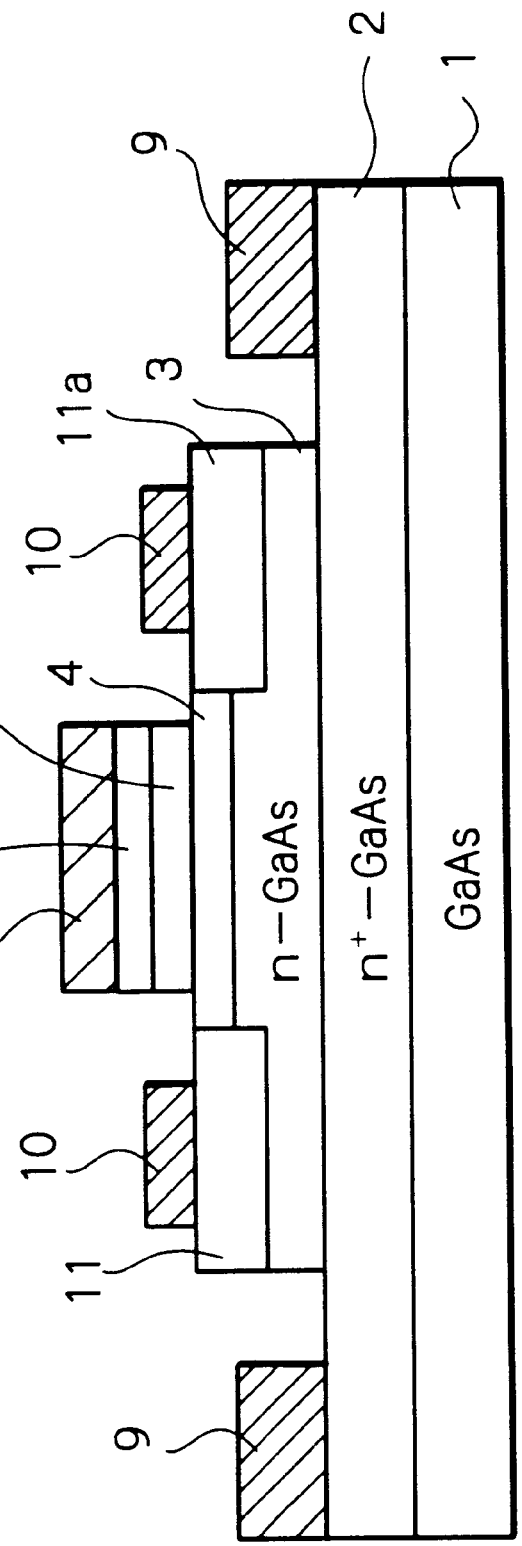
FIG. 3 is a cross-sectional view illustrating a third prior art HBT.

In FIG. 3, which illustrates a third prior art HBT, a base contact region 11a is provided on the sides of the base layer 4 of FIG. 1. The base contact region 11a is formed by implanting ions into the base layer 4 and the collector layer 3.

In the HBT of FIG. 3, however, since a high temperature heat treatment for activating implanted carriers is necessary after the ion-implantation, this heat treatment changes impurity distributions of the other semiconductor layers which deteriorates the characteristics thereof. Further, the ion-implantation damages the crystalline structure and thus increases recombination currents.

Figure 4:
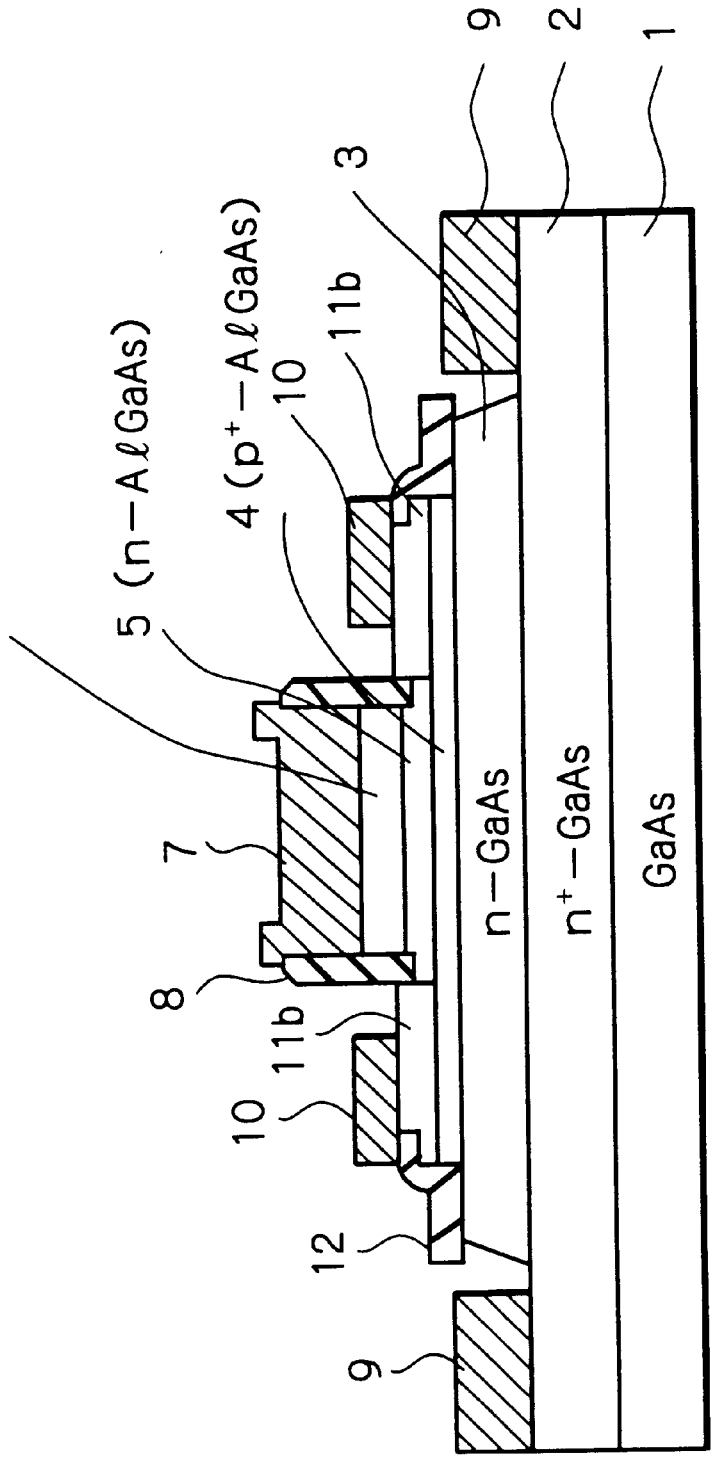
FIG. 4 is a cross-sectional view illustrating a fourth prior art HBT.

In FIGS. 4 and 5, which illustrate fourth and fifth prior art HBTs (see: H. Shimawaki et al., "High-$f_{max}$ AlGaAs/InGaAs and AlGaAs/GaAs HBT's with p$^+$/p Regrown Base Contacts", IEEE Trans. on Electron Devices, Vol. 42, No. 10, pp. 1735–1744, October 1995), a p$^+$-GaAs base contact layer 11b is regrown by an MOMBE process using silicon oxide layers 8 and 12 as a mask. In FIG. 4, the base contact layer 11b is grown on the base layer 4, while, in FIG. 5, the base contact layer 11b is grown on the collector layer 3. In both cases, even if the contact area between the base layer 4 and the base contact layer 11b is small, a sufficiently small base resistance can be obtained (see: Y. Amamiya et al., "Lateral p$^+$/p Regrown Base Contacts for AlGaAs/InGaAs HBTs with Extremely Thin Base Layers", IEEE 1996 54TH Annual Device Conference Digest, pp. 38–39, 1996).

In the prior art HBTs of FIGS. 4 and 5, since the base contact layers 11a and 11b are formed without ion-implantation, the energy band gap of the base contact layers 11a and 11b can be small, so that the ohmic contact resistance can be reduced. Also, since a high temperature heat treatment for activating carriers is unnecessary after the ion-implantation, the characteristics of the semiconductor layers are not deteriorated. Further, the damage of the crystalline structure can be avoided, and accordingly, recombination currents are not increased.

In the prior art HBTs of FIGS. 4 and 5, however when a graded Al composition layer is used as the base layer 5, an exposed surface of the base layer 5 is also easily oxidized by the open air in the same way as in FIG. 1. FIGS. 6A through 6J are cross-sectional views for explaining a first embodiment of the method for manufacturing an HBT according to the present invention.

First, referring to FIG. 6A, grown on a semi-insulating GaAs substrate 1 are an about 500 nm thick n$^+$-type GaAs collector contact layer 2 having a donor concentration of about $3 \times 10^{18}/cm^3$, an about 500 nm thick n-type GaAs collector layer 3 having a donor concentration of about $5 \times 10^{16}/cm^3$, an about 40 to 80 nm thick graded p$^+$-type $Al_xGa_{1-x}As$ (x:0~0.1) base layer 4 having an acceptor concentration of about $4 \times 10^{19}/cm^3$, an about 300 nm thick n-type $Al_{0.25}Ga_{0.75}As$ emitter layer 5 having a donor concentration of about $3\times10^{17}/cm^3$ and an about n$^+$-type $Al_yGa_{1-y}As$ (y:0.25~0)/GaAs/$In_zGa_{1-z}As$ (z:0~0.5)/$In_{0.5}Ga_{0.5}As$ emitter cap layer 6 by an MBE process, an MOCVD process or a VPF process.

Next, referring to FIG. 6B, an emitter electrode layer 7 is deposited on the emitter cap layer 6, and a silicon oxide layer 21 is deposited on the emitter electrode layer 7.

Next, referring to FIG. 6C, the silicon oxide layer 7 is patterned by a photolithography and etching process. Then, the emitter electrode layer 21 is patterned by an etching process using the silicon oxide layer 21 as a mask.

Next, referring to FIG. 6D, the emitter cap layer 6, the emitter layer 5 and the graded base layer 4 are sequentially etched by using the silicon oxide layer 21 as a mask.

Figure 6E:
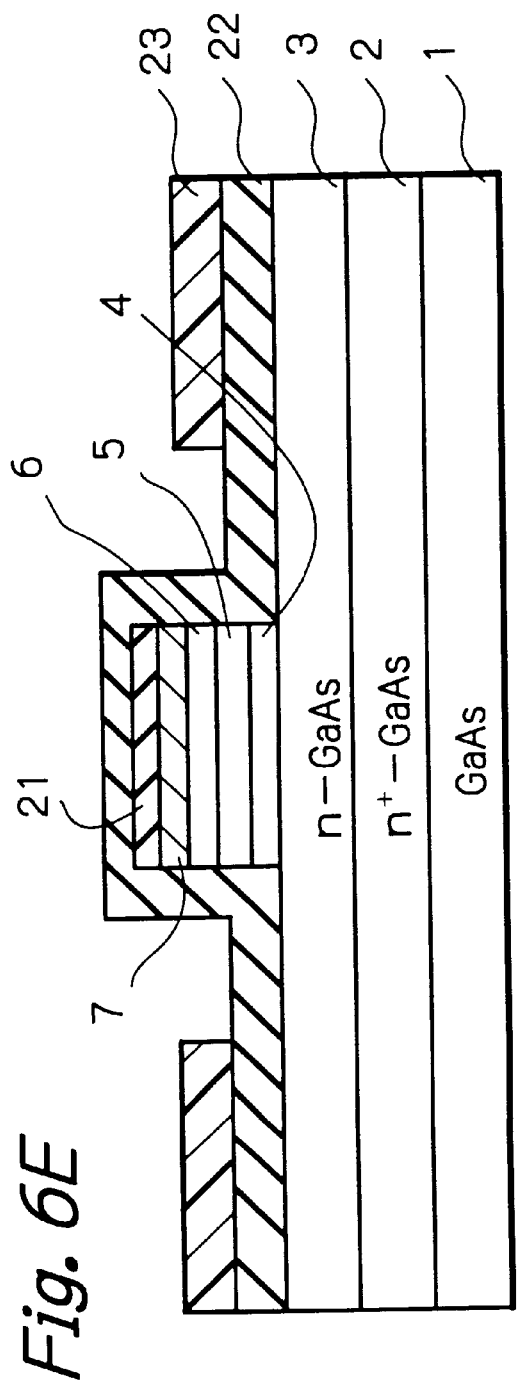

Next, referring to FIG. 6E, a silicon oxide layer 22 is deposited on the entire surface, and then, a photoresist pattern 23 is coated on the silicon oxide layer 22.

Figure 6F:
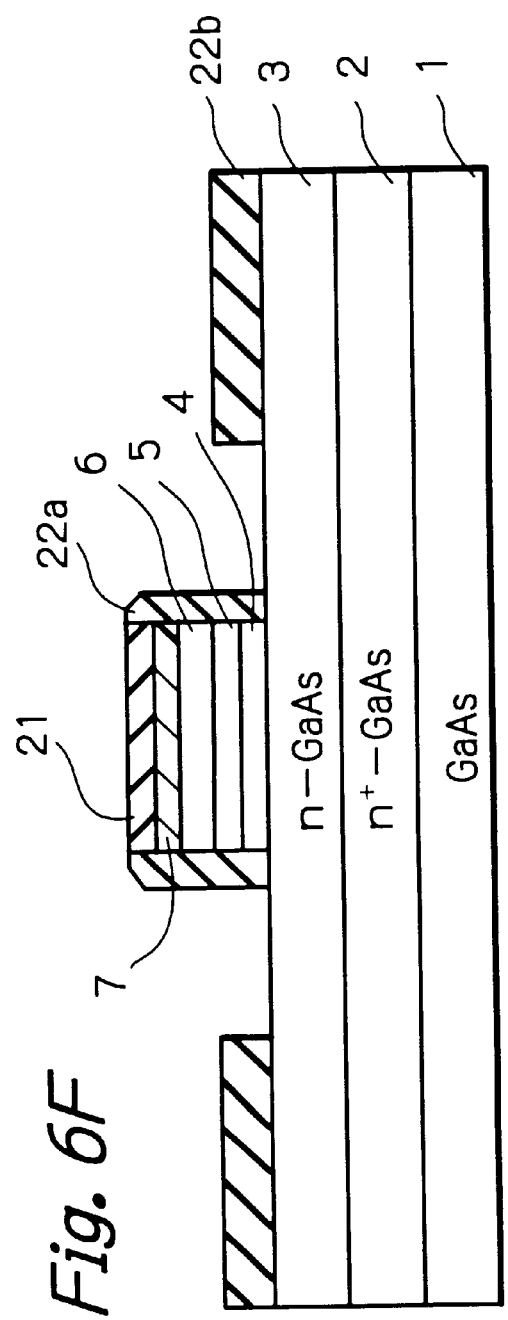

Next, referring to FIG. 6F, the photoresist 10 pattern 23 and the silicon oxide layer 22 are etched back by a reactive ion etching process, so that a sidewall silicon oxide layer 22a is left on the sidewalls of a mesa structure formed by the elements 4, 5, 6, 7 and 21, and a silicon oxide layer 22b is left as a mask.

Next, referring to FIG. 6G, an isotropic etching process such as a wet etching process is carried out by using the silicon oxide layers 21, 22a and 22b as a mask, so that a part of the collector layer 3 having a thickness of about 100 nm is etched. In this case, the side of the mesa structure is also etched due to the isotropic etching process. As a result, the lower surface of the graded base layer 4 is exposed. Note that the lower surface of the graded base layer 4 has little aluminum composition, and therefore, the lower surface of the graded base layer 4 is hardly oxidized by the open air.

Next, referring to FIG. 6H, an about 300 nm thick p$^+$-type GaAs base contact layer 11 having an acceptor concentration of about $4\times10^{20}/cm^3$ is grown by an MOMBE process using the silicon oxide layers 21, 22a and 22b as a mask. In this case, the base contact layer 11 is in contact with the lower surface of the base layer 4.

Next, referring to FIG. 6I, a part of the silicons oxide layer 22b is patterned by a photolithography and etching process, and then, the collector layer 3 is etched, so that a part of the collector contact layer 2 is exposed.

Finally, referring to FIG. 6J, a collector electrode layer 9 is formed on the collector contact layer 2, and a base electrode layer 10 is formed on the base contact layer 11, thus completing the HBT.

In the first embodiment, the base electrode layer 10 is connected to the base contact layer 11 having a high acceptor concentration, and the base contact layer 11 is connected to the lower surface of the base layer 4. That is, due to the presence of the low resistant base contact layer 11, a base resistance is reduced, thus improving the high frequency characteristics in the same way as in the HBTs of FIGS. 4 and 5.

In addition, the aluminum composition of the base layer 4 is graded so as to reduce the transit time of carriers within the base layer 4. In this case, since the aluminum composition at the lower surface of the base layer 4 is toward the energy band gap thereof is small, even if the base layer 4 is exposed during the growth of the base contact layer 11, the base layer 4 is hardly oxidized by the open air. Therefore, an ohmic contact resistance between the base contact layer 11 and the base layer 4 is reduced.

FIGS. 7A through 7J are cross-sectional views for explaining a second embodiment of the method for manufacturing an HBT according to the present invention.

Figure 7A:
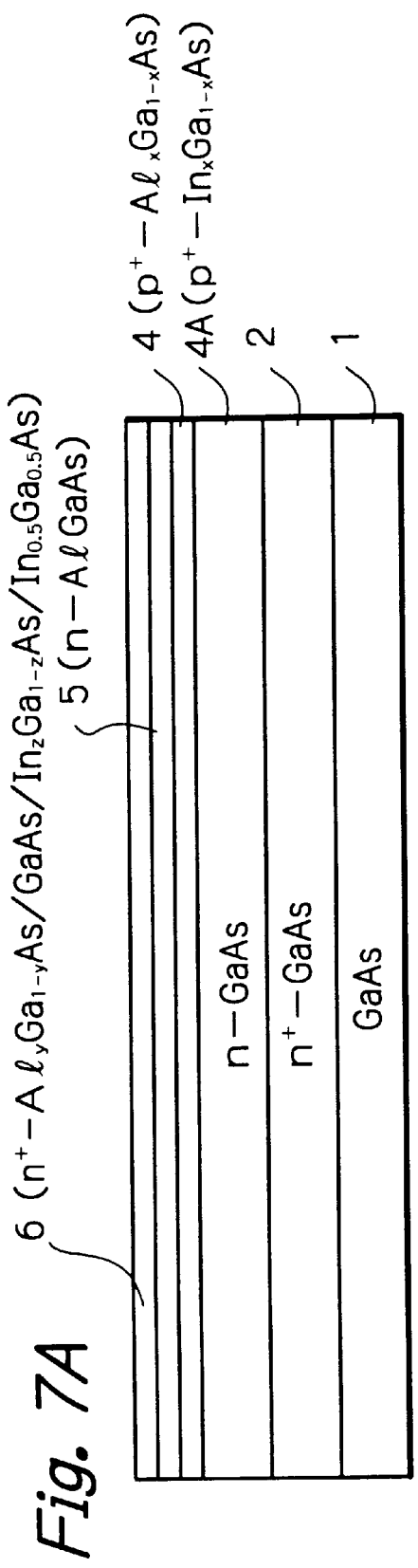

First, referring to FIG. 7A, grown on a semi-insulating GaAs substrate 1 are an about 500 nm thick n$^+$-type GaAs collector contact layer 2 having a donor concentration of about $3\times10^{18}/cm^3$, an about 500 nm thick n-type GaAs collector layer 3 having a donor concentration of about $5\times10^{16}/cm^3$, an about 20 to 40 nm thick p$^+$-type graded $In_xGa_{1-x}As$ (x:0.1~0) base layer 4A having an acceptor concentration of about $4\times10^{19}/cm^3$, an about 20 to 40 nm thick graded p$^+$-type $Al_xGa_{1-x}As$ (x:0~0.1) base layer 4 having an acceptor concentration of about $4\times10^{19}/cm^3$, an about 300 nm thick n-type $Al_{0.25}Ga_{0.75}As$ emitter layer 5 having a donor concentration of about $3\times10^{17}cm^3$ and an about n$^+$-type $Al_yGa_{1-y}As$ (y:0.25~0)/GaAs/$In_zGa_{1-z}As$ (z:0~5)/$In_{0.5}Ga_{0.5}As$ emitter cap layer 6 by an BME process, an MOCVD process or a VPE process.

The composition of $In_xGa_{1-x}As$ of the base layer 4A is graded from x=0.1 at the interface between the collector layer 3 and the base layer 4A to x=0 at the interface between the base layer 4A to the base layer 4. In this graded In composition base region 4A, the energy band gap is gradually decreased from the emitter side to the collector side, so that a strong electric field is generated within the base region 4A, thus reducing the transit time of carriers within the base layer 4A. This increases the operation speed of the HBT.

Figure 7B:
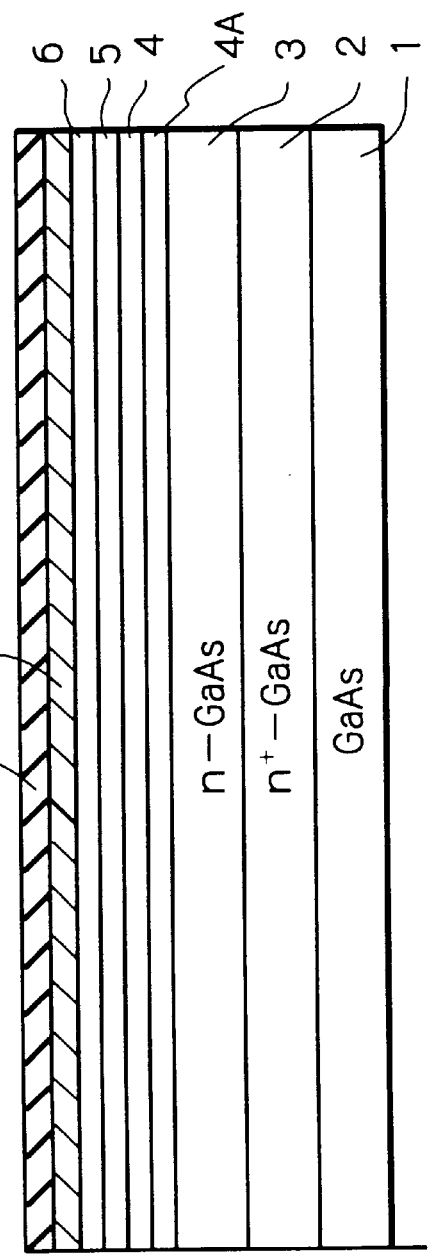

Next, referring to FIG. 7B, in the same way as in FIG. 68, an emitter electrode layer 7 is deposited on the emitter can layer 6, and a silicon oxide layer 21 is deposited on the emitter electrode layer 7.

Next, referring to FIG. 7C, in the same way as in FIG. 6C, the silicon oxide layer 7 is patterned by a photolithography and etching process. Then, the emitter electrode layer 21 is patterned by an etching process using the silicon oxide layer 21 as a mask.

Next, referring to FIG. 7D, in the same way as in FIG. 6D, the emitter cap layer 6, the emitter layer 5 and the graded base layer 4 are sequentially etched by using the silicon oxide layer 21 as a mask.

Next, referring to FIG. 7E, in the same way as in FIG. 6E, a silicon oxide layer 22 is deposited on the entire surface, and then, a photoresist pattern 23 is coated on the silicon oxide layer 22.

Next, referring to FIG. 7F, in the salve way as in FIG. 6F, the photoresist pattern 23 and the silicon oxide layer 22 are etched back by a reactive ion etching process, so that a sidewall silicon oxide layer 22a is left on the sidewalls of a mesa structure formed by the elements 4, 5, 6, 7 and 21, and a silicon oxide layer 22b is left as a mask.

Next, referring to FIG. 7G, an isotropic etching process such as a wet etching process using phosphoric acid or hydrogen peroxide water is carried out by rising the silicon oxide layers 21, 22a and 22b as a mask, so that a part of the graded base layer 4A is etched. In this case, the side of the graded base layer 4A is also etched due to th,e isotropic etching process. As a result, the lower surface or the graded base layer 4 is exposed. Note that the lower surface of the graded base layer 4 has little aluminum composition, and therefore, the lower surface of the graded base layer 4 is hardly oxidized by the open air.

Next, referring to FIG. 7H, in a similar way to FIG. 6H, an about 300 nm thick p$^+$-type GaAs base contact layer 11 having an acceptor concentration of about $4\times10^{20}/cm^3$ is grown by an MOMBE process using the silicon oxide layers 21, 22a and 22b as a mask. In this case, the base contact layer 11 is in contact with the lower surface of the base layer 4.

Figure 7I:
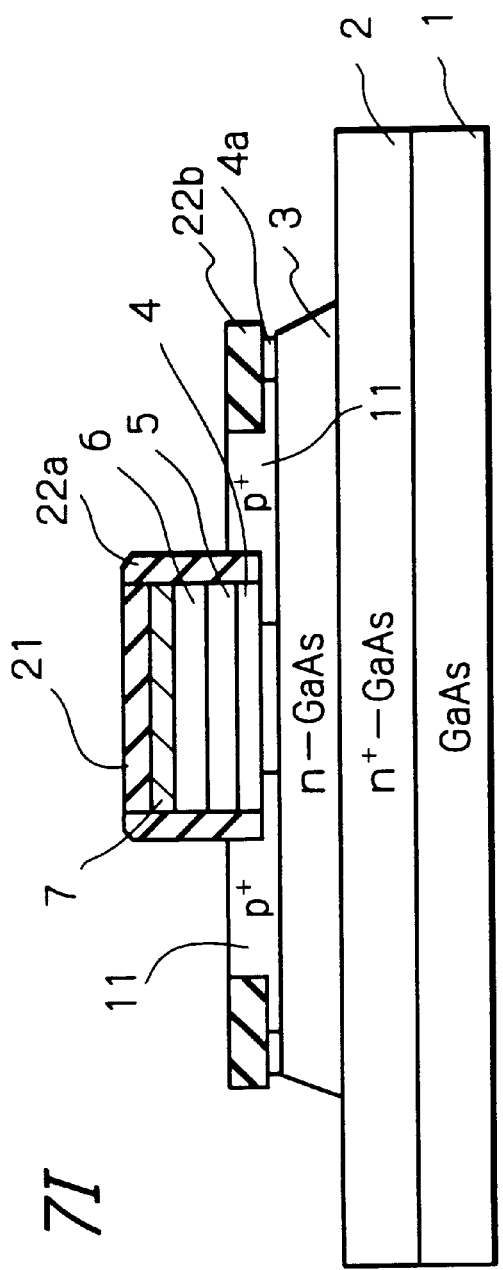

Next, referring to FIG. 7I, in a similar way to FIG. 6I, a part of the silicon oxide layer 22b is patterned by a photolithography and etching process, and then, the graded base layer 4A and the collector layer 3 are etched, so that a part of the collector contact layer 2 is exposed.

Figure 7J:
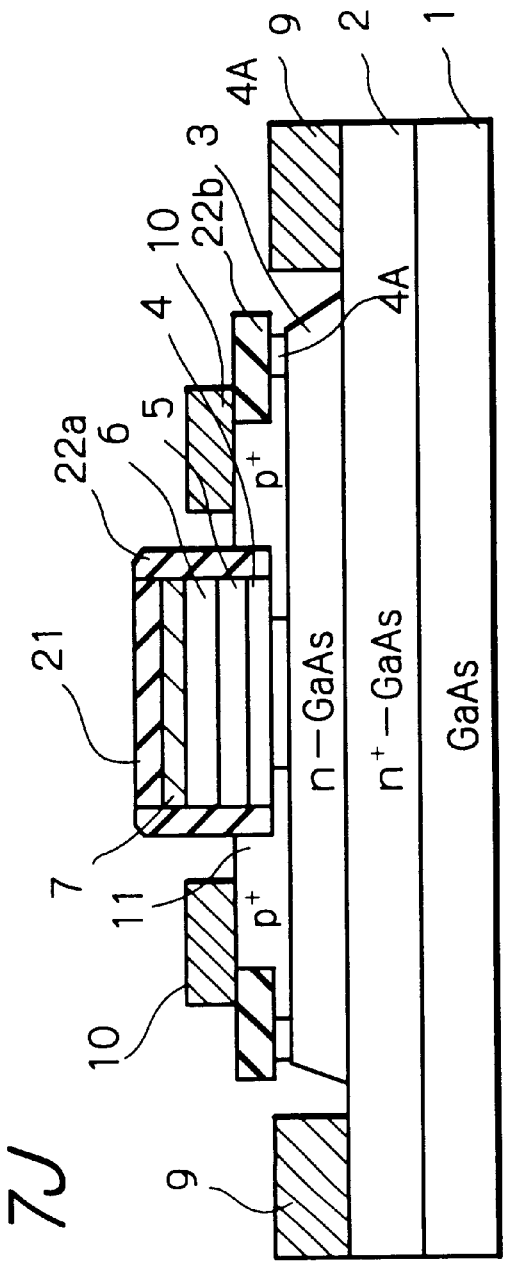

Finally, referring to FIG. 7J, in the same way as in FIG. 6J, a collector electrode layer 9 is formed on the collector contact layer 2, and a base electrode layer 10 is formed on the base contact layer 11, thus completing the HBT.

Even in the second embodiment, the base electrode layer 10 is connected to the base contact layer 11 having a high acceptor concentration, and the base contact Layer 11 is connected to the lower surface of the base layer 4. That is, due to the presence of the low resistant base contact layer 11, a base resistance is reduced, thus improving the high frequency characteristics in the same way as in the HBTs of FIGS. 4 and 5.

In addition, the aluminum composition of the base layer 4 is graded so as to reduce the transit time of carriers within the base layer 4. In this case, since the aluminum composition at the lower surface of the base layer 4 is low and the energy band gap thereof is small, even if the base layer 4 is exposed during the growth of the base contact layer 11, the base layer 4 is hardly oxidized by the open air. Therefore, an ohmic contact resistance between the base contact layer 11 and the base layer 4 is reduced.

Further, since a base layer is constructed by double layers, i.e., the base layers 4 and 4A which have a high etching rate ratio for phosphoric acid or hydrogen peroxide water, the base layer 4 is hardly etched. As a result, the part of the base layer 4 where the aluminum composition is high and the energy band gap is large is hardly exposed.

In addition, in the first embodiment, the collector layer 3 is etched for the formation of the base contact layer 11, the collector layer 3 becomes thin, which reduces base-collector breakdown voltage. On the other hand, in the second embodiment, since the collector layer 3 is not etched for the formation of the base contact layer 11, the base-collector breakdown voltage is not reduced.

FIGS. 8A through 8J are cross-sectional views for explaining a third embodiment of the method for manufacturing an HBT according to the present invention.

Figure 8A:
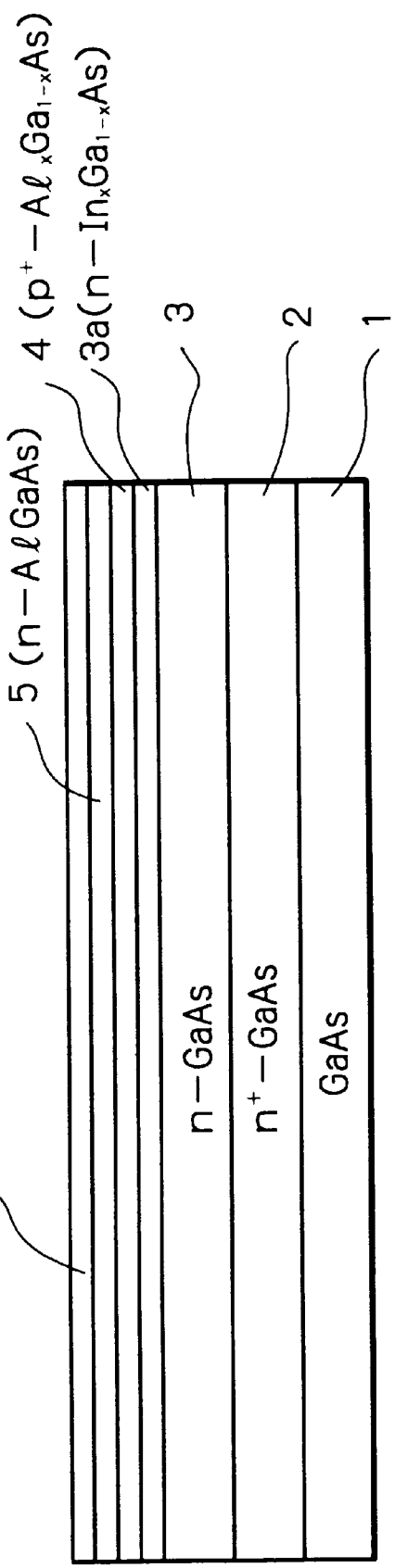

First, referring to FIG. 8A, grown on a semi-insulating GaAs substrate 1 are an about 500 nm thick n$^+$-type GaAs collector contact layer 2 having a donor concentration of about $3\times10^{18}$/cm$^3$, an about 400 nm thick n-type GaAs collector layer 3 having a donor concentration of about $5\times10^{16}$/cm$^3$, an about 100 nm thick n-type In$_x$Ga$_{1-x}$As (x<0.5) collector layer 3A having a donor concentration of about $5\times10^{16}$/cm$^3$, an about 40 to 80 nm thick graded p$^+$-type Al$_x$Ga$_{1-x}$As (x:0~0.1) base layer 4 having an acceptor concentration of about $4\times10^{19}$/cm$^3$, an about 300 nm thick n-type Al$_{0.25}$Ga$_{0.75}$As emitter layer 5 having a donor concentration of about $3\times10^{17}$/cm$^3$ and an about n$^+$-type Al$_y$Ga$_{1-y}$As (y:0.25~0)/GaAs/In$_z$Ga$_{1-z}$As (z:0~0.5)/ In$_{0.5}$Ga$_{0.5}$As emitter cap layer 6 by an MBE process, an MOCVD process or a VPE process.

Figure 8B:
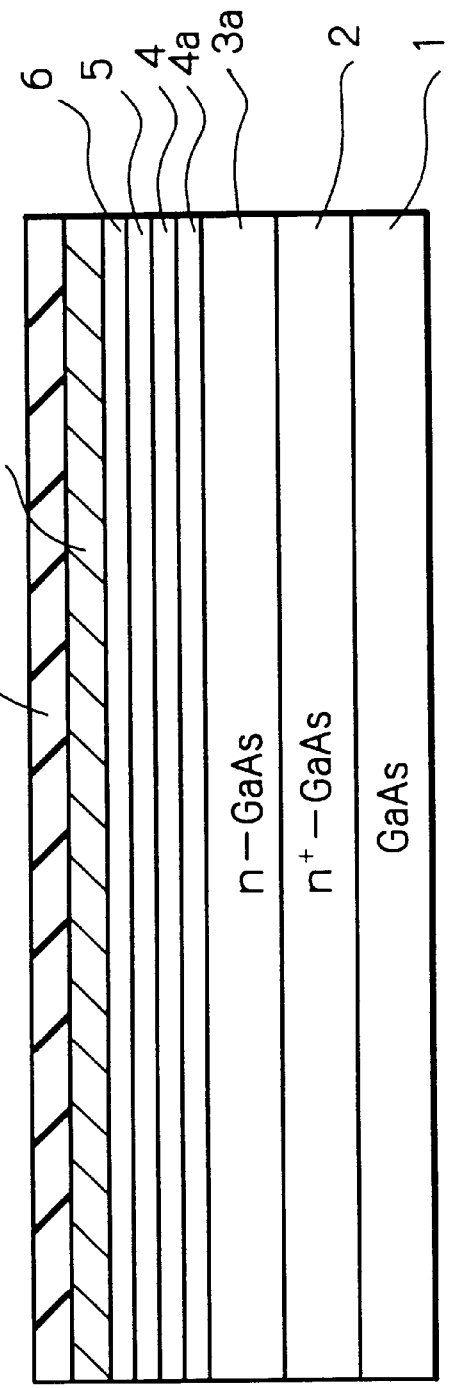

Next, referring to FIG. 8B, in the same way as in FIG. 7B, an emitter electrode layer 7 is deposited on the emitter cap layer 6, and a silicon oxide layer 21 is deposited on the emitter electrode layer 7.

Figure 8C:
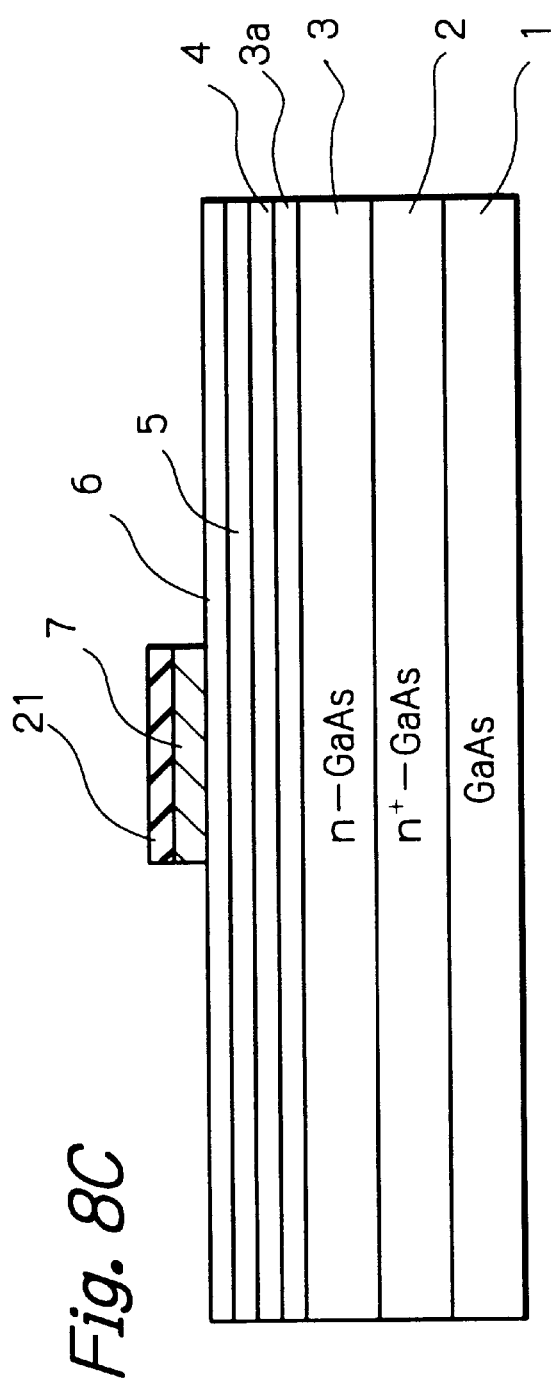

Next, referring to FIG. 8C, in the same way as in FIG. 7C, the silicon oxide layer 7 Is patterned by a photolithography and etching process. Then, the emitter electrode layer 21 is patterned by an etching process using the silicon oxide layer 21 as a mask.

Figure 8D:
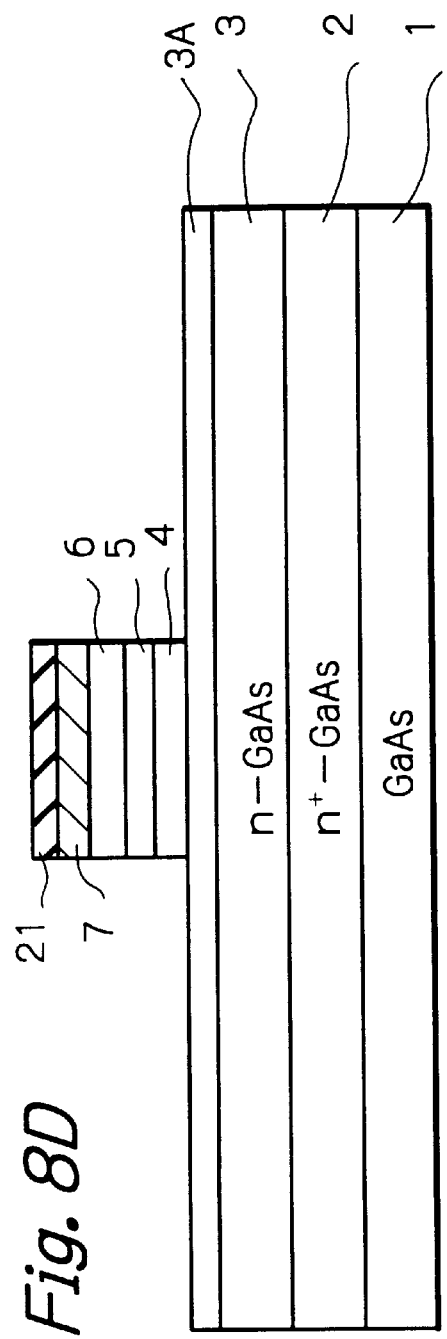

Next, referring to FIG. 8D, in the same way as in FIG. 7D, the emitter cap layer 6, the emitter layer 5 and the graded base layer 4 are sequentially etched by using the silicon oxide layer 21 as a mask.

Next, referring to FIG. 8E, in the same way as in FIG. 7E, a silicon oxide layer 22 is deposited on the entire surface, and then, a photoresist pattern 23 is coated on the silicon oxide layer 22.

Next, referring to FIG. 8F, in the same way as in FIG. 7F, the photoresist pattern 23 and the silicon oxide layer 22 are etched back by a reactive ion etching process, so that a sidewall silicon oxide layer 22a is left on the sidewalls of a mesa structure formed by the elements 4, 5, 6, 7 and 21, and a silicon oxide layer 22b is left as a mask.

Figure 8G:
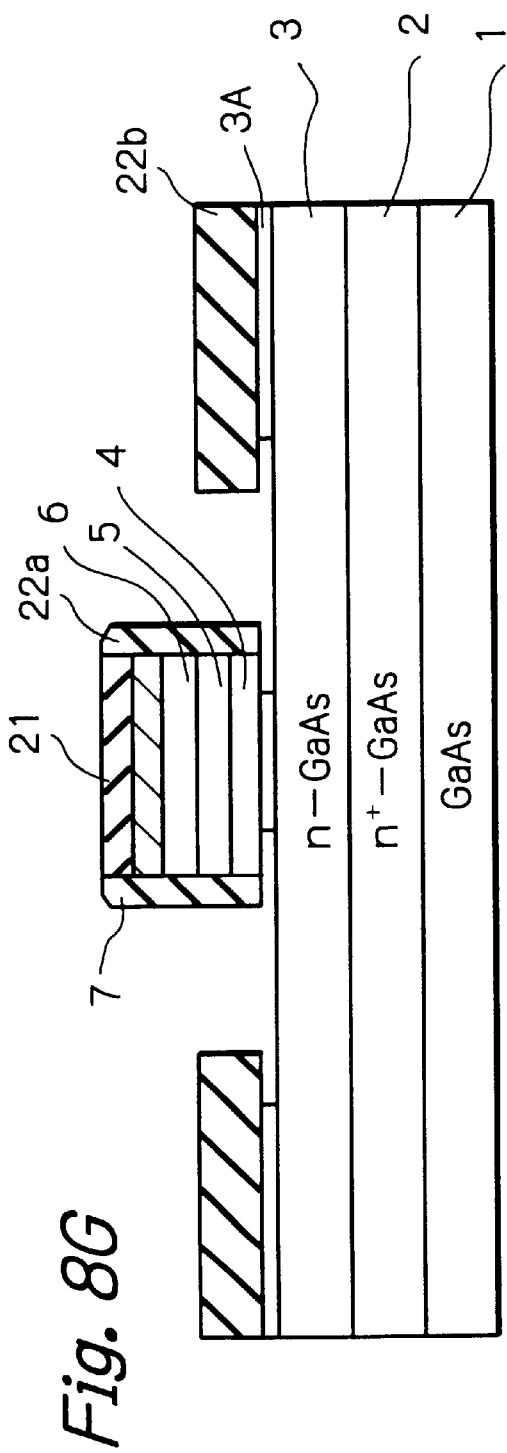

Next, referring to FIG. 8G, in a similar way to FIG. 7G, an isotropic etching process such as a wet etching process using phosphoric acid or hydrogen peroxide water is carried out by using the silicon oxide layers 21, 22a and 22b as a mask, so that a part of the collector layer 3A is etched. In this case, the side of the collector layer 3A is also etched due to the isotropic etching process. As a result, the lower surface of the graded base layer 4 is exposed. Note that the lower surface of the graded base layer 4 has little aluminum composition, and therefore, the lower surface of the graded base layer 4 is hardly oxidized by the open air.

Figure 8H:
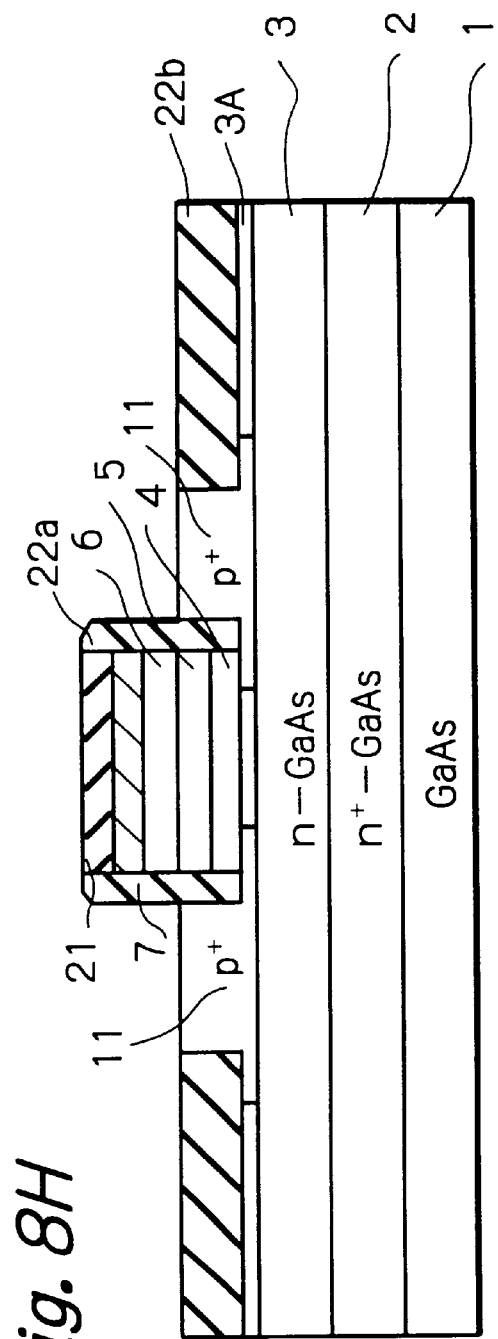

Next, referring to FIG. 8H, in the same way as in FIG. 7H, an about 300 nm thick p$^+$-type GaAs base contact layer 11 having an acceptor concentration of about $4\times10^{20}$/cm$^3$ is grown by an MOMBE process using the silicon oxide layers 21, 22a and 22b as a mask. In this case, the base contact layer 11 is in contact with the loser surface of the base layer 4.

Figure 8I:
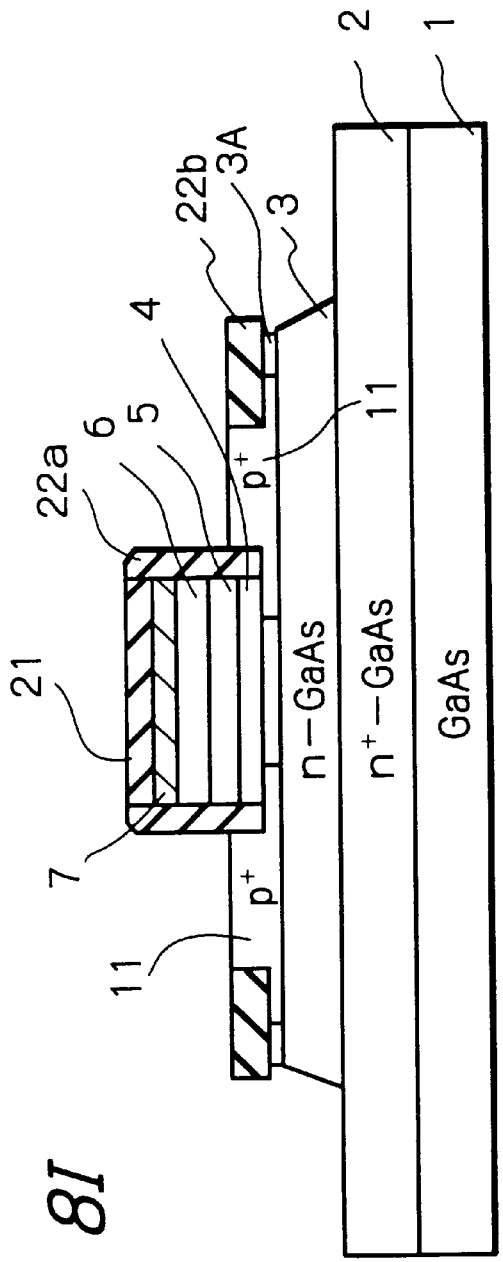

Next, referring to FIG. 8I, in the same way as in FIG. 7I, a part of the silicon oxide layer 22b is patterned by a photolithography and etching process, and then, the collector layer 3A and the collector layer 3 are etched, so that a part of the collector contact layer 2 is exposed.

Figure 8J:
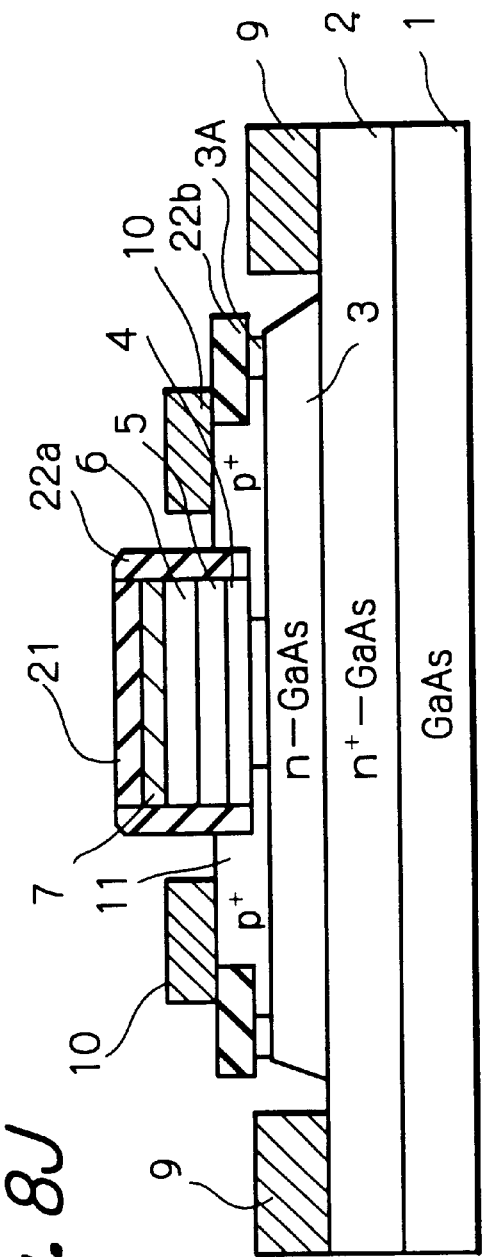

Finally, referring to FIG. 8J, in the same way as in FIG. 7J, a collector electrode layer 9 is formed on the collector contact layer 2, and a base electrode layer 10 is formed on the base contact layer 11, thus completing the HBT.

Even in the third embodiment, the base electrode layer 10 is connected to the base contact layer 11 having a high acceptor concentration, and the base contact layer 11 is connected to the lower surface of the base layer 4. That is, due to the presence of the low resistant base contact layer 11, a base resistance is reduced, thus improving the high frequency characteristics in the same way as in the HBTs of FIGS. 4 and 5.

In addition, the aluminum composition of the base layer 4 is graded so as to reduce the transit time of carriers within the base layer 4. In this case, since the aluminum composition at the lower surface of the base layer 4 is low and the energy band gap thereof is small, even if the base layer 4 is exposed during the growth of the base contact layer 11, the base layer 4 is hardly oxidized by the open air. Therefore, an ohmic contact resistance between the base contact layer 11 and the base layer 4 is reduced.

Further, a collector layer is constructed by double layers, i.e., the collector layers 3 and 3A. In this case, since the etching rate ratio of the collector layer 3A (InGaAs) to the collector layer 3 (GaAs) and the base layer 4 (AlGaAs) for phosphoric acid or hydrogen peroxide water is large, the collector layer 3 and the base layer 4 are hardly etched. As a result, the part of the base layer 4 where the aluminum composition is high and the energy bard gap is large is hardly exposed.

In addition, in the third embodiment, since the collector layer 3 is riot etched for the formation of the base contact layer 11, the base-collector breakdown voltage is not reduced.

Figure 9A:
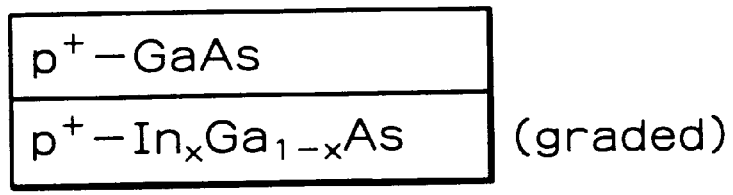
Figure 9B:
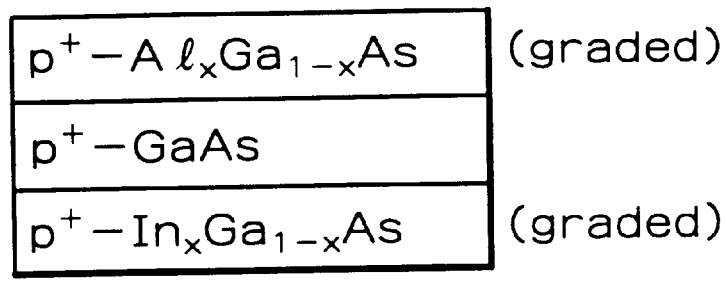
Figure 9C:
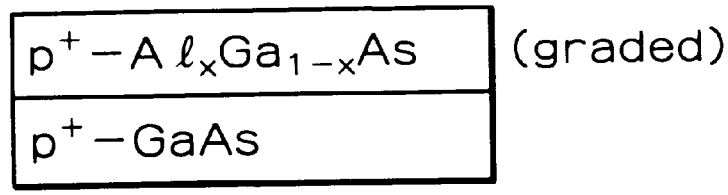
Figure 10:
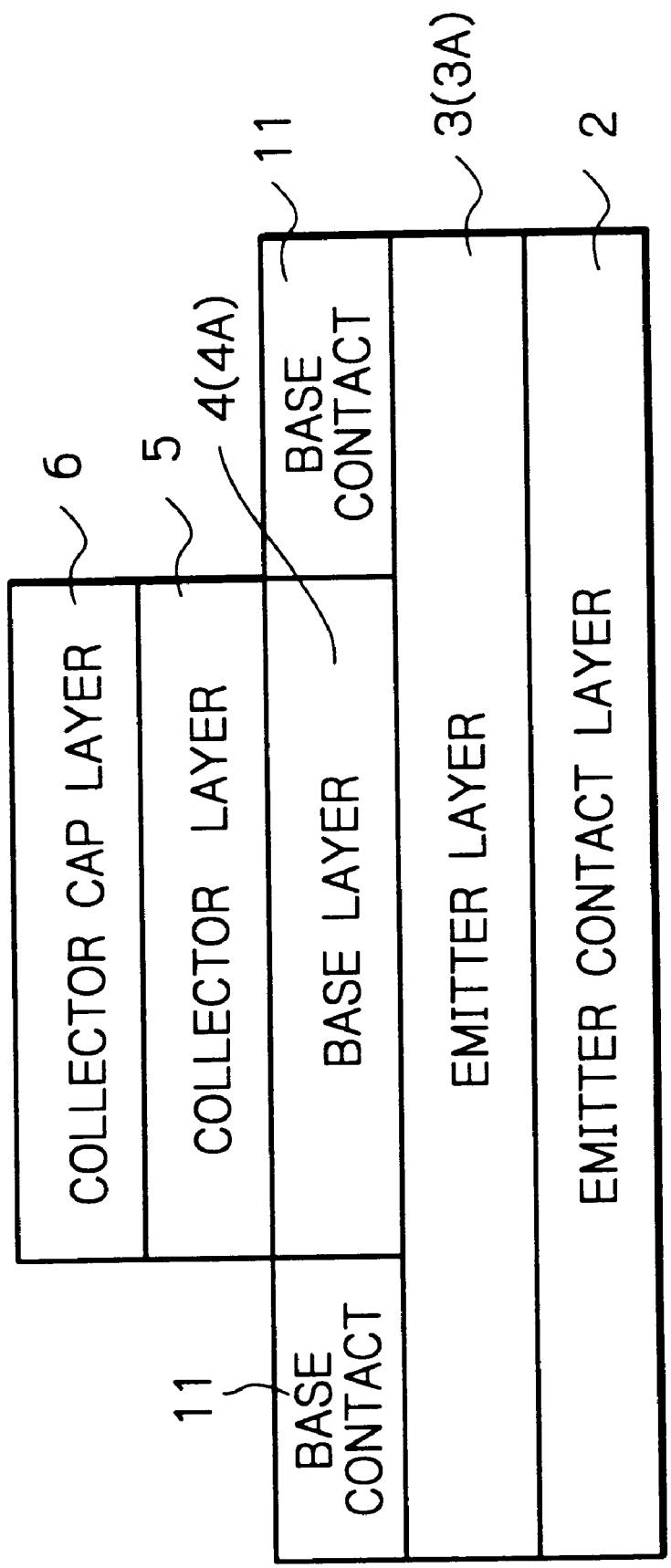
FIG. 10 is a cross-sectional view-illustrating a modification of the embodiments.

In the above-described first and third embodiments, the base layer 4 can be formed by stacked layers made of $p^+$-type $In_xGa_{1-x}As/GaAs$ as illustrated in FIG. 9A or made of $p^+$-type $In_xGa_{1-x}As/GaAs/Al_xGa_{1-x}As$ as illustrated in FIG. 9B. In this case, the $In_xGa_{1-x}As$ layer is graded from x=0 on the emitter side to x=0.1 on the collector side. In addition, in the above-described second embodiment, the base layer 4 can be formed by stacked layers made of $p^+$-type $GaAs/Al_xGa_{1-x}As$ as illustrated in FIG. 9C.

Additionally, in the second embodiment, the base layer 4A can be replaced by an undoped GaAs layer. Similarly, in the third embodiment, the collector layer 3A can be replaced by an undoped GaAs layer.

Further, in the above-described embodiments, when the polarities of voltages applied to the emitter electrode layer 7, the collector electrode layer 9 and the base electrode layer 10 are changed, the layers 2, 3 (3A), 4 (4A), 5, 6 and 11 can serve as an emitter contact layer, an emitter layer, a base layer, a collector layer, a collector cap layer and a base contact layer, respectively. Even in this case, the base contact layer 11 is in contact with a part of the lower surface of the base layer 4 (4A). Note that the base layer 5 is made of graded $In_xGa_{1-x}As$ where x is gradually increased from the emitter side to the collector side.

As explained hereinabove, according to the present invention, the high frequency characteristics can be improved. Also, an ohmic contact resistance between the base contact layer and the base layer can be reduced. Further, the part of the base layer where the aluminum composition is high and the energy band gap is large is hardly exposed.

I claim:

1. A bipolar transistor comprising:
   a semi-insulating substrate;
   a first collector layer of a first conductivity type, formed on said semi-insulating substrate;
   a first base layer of a second conductivity type opposite to said first conductivity type, formed on said first collector layer; and
   a base contact layer of said second conductivity type in contact with and underlying a part of a lower surface of said first base layer.

2. The bipolar transistor as set forth in claim 1, further comprising a second base layer interposed between said first collector layer and said first base layer, said second base layer being narrower than said first base layer,
   said base contact layer being in contact with the part of the lower surface of said first base layer where said second base layer is not provided.

3. The bipolar transistor as set forth in claim 1, further comprising a second collector layer interposed between said first collector layer and said first base layer, said second collector layer being narrower than said first base layer,
   said base contact layer being in contact with the part of the lower surface of said first base layer where said second collector layer is not provided.

4. The bipolar transistor as set forth in claim 1, further comprising an instrinsic layer interposed between said first collector layer and said first base layer, said undoped layer being narrower than said first base layer,
   said base contact layer being in contact with the part of the lower surface of said first base layer where said undoped layer is not provided.

5. The bipolar transistor as set forth in claim 1, wherein said first base layer comprises at least one composition graded layer having an energy band gap which is gradually reduced from an emitter side to a collector side.

6. The bipolar transistor as set forth in claim 5, wherein said composition graded layer is made of $Al_xGa_{1-x}As$ where x is gradually reduced from the emitter side to the collector side.

7. A bipolar transistor comprising:
   a semi-insulating substrate;
   a first emitter layer of a first conductivity type, formed on said semi-insulating substrate;
   a first base layer of a second conductivity type, formed on said first emitter layer; and
   a base contact layer of said second conductivity type in contact with and underlying a part of a lower surface of said first base layer.

8. The bipolar transistor as set forth in claim 7, further comprising a second base layer interposed between said first emitter layer and said first base layer, said second base layer being narrower than said first base layer,
   said base contact layer being in contact with the part of the lower surface of said first base layer where said second base layer is not provided.

9. The bipolar transistor as set forth in claim 7, further comprising a second emitter layer interposed between said first emitter layer and said first base layer, said second emitter layer being narrower than said first base layer,
   said base contact layer being in contact with the part of the lower surface of said first base layer where said second emitter layer is not provided.

10. The bipolar transistor as set forth in claim 7, further comprising an instrinsic layer interposed between said first emitter layer and said first base layer, said undoped layer being narrower than said first base layer,
    said base contact layer being in contact with the part of the lower surface of said first base layer where said undoped layer is not provided.

11. The bipolar transistor as set forth in claim 7, wherein said first base layer comprises at least one composition graded layer having an energy band gap which is gradually reduced from an emitter side to a collector side.

12. The bipolar transistor as set forth in claim 11, wherein said composition graded layer is made of $Al_xGa_{1-x}As$ where x is gradually reduced from the emitter side to the collector side.

13. A bipolar transistor comprising:
    a semi-insulating substrate;
    a collector contact layer of a first conductivity type, formed an said semi-insulating substrate;
    a collector layer of said first conductivity type, formed on said collector contact layer;
    a mesa structure formed on said collector layer, said mesa structure including a base layer of a second conductivity type opposite to said first conductivity type on said collector layer, an emitter layer of said first conductivity type formed on said base layer, an emitter cap layer of said first conductivity type formed on said emitter layer, and a sidewall insulating layer formed on sidewalls of said base layer, said emitter layer and said emitter contact layer; and
    a base contact layer of said second conductivity type formed on said collector layer outside of said mesa structure,
    said base contact layer extending beneath said sidewall insulating layer and being in contact with a part of a lower surface of said base layer.

14. The bipolar transistor as set forth in claim 13, wherein said base layer comprises at least one composition graded layer having an energy band gap which is gradually reduced from an emitter side to a collector side.

15. The bipolar transistor as set forth in claim 14, wherein said composition graded layer is made of $Al_xGa_{1-x}As$ where x is gradually reduced from the emitter side to the collector side.

16. A bipolar transistor comprising:
a semi-insulating substrate;
an emitter contact layer of a first conductivity type, formed on said semi-insulating substrate;
an emitter layer of said first conductivity type, formed on said emitter contact layer;
a mesa structure formed on said collector layer, said mesa structure including a base layer of a second conductivity type opposite to said first conductivity type on said emitter layer, a collector layer of said first conductivity type former on said base layer, a collector cap layer of said first conductivity type formed on said collector layer, and a sidewall insulating layer formed on sidewalls of said base layer, said collector layer and said collector contact layer; and
a base contact layer of said second conductivity type formed on said emitter layer outside of said mesa structure,
said base contact layer extending beneath said sidewall insulating layer and being in contact with a part of a lower surface of said base layer.

17. The bipolar transistor as set forth in claim 16, wherein said base layer comprises at least one composition graded layer having an energy band gap which is gradually reduced from an emitter side to a collector side.

18. The bipolar transistor as set forth in claim 17, wherein said composition graded layer is made of $In_xGa_{1-x}As$ where x is gradually reduced from the emitter side to the collector side.

19. A bipolar transistor comprising:
a semi-insulating substrate;
a collector contact layer of a first conductivity type, formed on said semi-insulating substrate;
a collector layer of said first conductivity type, formed on said collector contact layer;
a first base layer of a second conductivity type opposite to said first conductivity type, formed on said collector layer;
a mesa structure formed on said first base layer, said mesa structure including a second base layer of said second conductivity type on said first base layer, an emitter layer of said first conductivity type formed on said second base layer, an emitter cap layer of said first conductivity type formed on said emitter layer, and a sidewall insulating layer formed on sidewalls of said second base layer, said emitter layer and said emitter contact layer, said mesa structure being wider than said first base layer; and
a base contact layer of said second conductivity type formed on said collector layer outside of said mesa structure,
said base contact layer extending beneath said sidewall insulating layer and being in contact with a part, of a lower surface of said second base layer.

20. The bipolar transistor as set forth in claim 19, wherein said second base layer comprises all least one composition graded layer having an energy band gap which is gradually reduced from an emitter side to a collector side.

21. The bipolar transistor as set forth in claim 20, wherein said composition graded layer is made of $Al_xGa_{1-x}As$ where x is gradually reduced from the emitter side to the collector side.

22. The bipolar transistor as set forth in claim 19, wherein said first base layer comprises a composition graded layer having an energy band gap which is gradually reduced from an emitter side to a collector side.

23. The bipolar transistor as set forth in claim 22, wherein said composition graded layer is made of $In_xGa_{1-x}As$ where x is gradually increased from the emitter side to the collector side.

24. A bipolar transistor comprising;
a semi-insulating substrate;
an emitter contact layer of a first conductivity type, formed on said semi-insulating substrate,
an emitter layer of said first conductivity type, formed on said emitter contact layer;
a first base layer of a second conductivity type opposite to said first conductivity type, formed on said emitter layer;
a mesa structure formed on said first base layer, said mesa structure including a second base layer of said second conductivity type on said first base layer, a collector layer of said first conductivity type formed on said second base layer, a collector cap layer of said first conductivity type formed on said collector layer, and a sidewall insulating layer formed on sidewalls of said second base layer, said collector layer and said collector contact layer, said mesa structure being wider than said first base layer; and
a base contact layer of said second conductivity type formed on said emitter layer outside of said mesa structure,
said base contact layer extending beneath said sidewall insulating layer and being in contact with a part of a lower surface of said first base layer.

25. The bipolar transistor as set forth in claim 24, wherein said second base layer comprises at least one composition graded layer having an energy band gap which is gradually reduced from an emitter side to a collector side.

26. The bipolar transistor as set forth in claim 25, wherein said composition graded Layer is made of $In_xGa_{1-x}As$ where x is gradually reduced from the collector side to the emitter side.

27. The bipolar transistor as set forth in claim 24, wherein said first base layer comprises a composition graded layer having an energy hand gap which is gradually reduced from an emitter side to a collector side.

28. The bipolar transistor as set forth in claim 27, wherein said composition graded layer is made of $In_xGa_{1-x}As$ where x is gradually increased from the emitter side to the collector side.

29. A bipolar transistor comprising:
a semi-insulating substrate;
a collector contact layer of a first conductivity type, formed on said semi-insulating substrate;
a first collector layer of said first conductivity type, formed on said collector contact layer;
a second collector layer of said first second conductivity type, formed on said first collector layer;
a mesa structure formed on said second collector layer, said mesa structure including a base layer of a second conductivity type opposite to said first conductivity type on said second collector layer, an emitter layer of said first conductivity type formed on said base layer, an emitter cap layer of said first conductivity type formed on said emitter layer, and a sidewall insulating layer formed on sidewalls of said base layer, said emitter layer and said emitter contact layer, said mesa structure being wider than said base layer; and a base contact layer of said second conductivity tape formed on said first collector layer outside of said mesa structure, said base contact layer extending beneath said sidewall insulating layer and being in contact with a part of a lower surface of said base layer.

30. The bipolar transistor as set forth in claim 29, wherein said base layer comprises at least one composition graded layer having are energy band gap which is gradually reduced from an emitter side to a collector side.

31. The bipolar transistor as set forth in claim 29, wherein said composition graded layer is made of $Al_xGa_{1-x}As$ where x is gradually reduced from the emitter side to the collector side.

32. The bipolar transistor as set forth in claim 29, wherein said second collector layer comprises a composition graded layer having an energy band gap which is gradually reduced from an emitter side to a collector side.

33. The bipolar transistor as set forth in claim 32, wherein said composition graded layer is made of $In_xGa_{1-x}As$ where x is gradually increased from the emitter side to the collector side.

34. A bipolar transistor comprising:

a semi-insulating substrate;

an emitter contact layer of a first conductivity type, formed on said semi-insulating substrate;

a first emitter layer of said first conductivity type, formed on said emitter contact layer;

a second emitter layer of said first second conductivity type, formed on said first emitter layer;

a mesa structure formed on said second emitter layer, said mesa structure including a base layer of a second conductivity type opposite to said first conductivity type on said second emitter layer, a collector layer of said first conductivity type formed on said base layer, a collector cap layer of said first conductivity type formed on said collector layer, and a sidewall insulating layer formed on sidewalls of said base layer, said collector layer and said collector contact layer, said mesa structure being wider than said base layer; and a base contact layer of said second conductivity type formed on said first emitter layer outside of said mesa structure, said base contact layer extending beneath said sidewall insulating layer and being in contact with a part of a lower surface of said base layer.

35. The bipolar transistor as set forth in claim 34, wherein said base layer comprises at least one composition graded layer having an energy band gap which is gradually reduced from an emitter side to a collector side.

36. The bipolar transistor as set forth in claim 35, wherein said composition graded layer is made of $In_xGa_{1-x}As$ where x is gradually reduced from the collector side to the emitter side.

37. The bipolar transistor as set forth in claim 34, wherein said second emitter layer comprises a composition graded layer having an energy band gap which is gradually reduced from an emitter side to a collector side.

38. The bipolar transistor as set forth in claim 37, wherein said composition graded layer is made of $In_xGa_{1-x}As$ where x is gradually increased from the emitter side to the collector side.

* * * * *